(12) United States Patent
Kim et al.

(10) Patent No.: US 12,096,665 B2
(45) Date of Patent: Sep. 17, 2024

(54) DISPLAY DEVICE HAVING A SENSOR DISPOSED UNDER THE DISPLAY PANEL

(71) Applicant: LG DISPLAY CO., LTD., Seoul (KR)

(72) Inventors: Won Rae Kim, Paju-si (KR); Seung Cheol You, Paju-si (KR); Chae Kyung Lim, Paju-si (KR)

(73) Assignee: LG DISPLAY CO., LTD., Seoul (KR)

(*) Notice: Subject to any disclaimer, the term of this patent is extended or adjusted under 35 U.S.C. 154(b) by 524 days.

(21) Appl. No.: 17/512,396

(22) Filed: Oct. 27, 2021

(65) Prior Publication Data
US 2022/0130935 A1 Apr. 28, 2022

(30) Foreign Application Priority Data
Oct. 28, 2020 (KR) .......................... 10-2020-0140818

(51) Int. Cl.
H10K 59/65 (2023.01)
H04N 23/57 (2023.01)
H10K 50/80 (2023.01)
H10K 50/86 (2023.01)
H10K 59/126 (2023.01)
H10K 59/38 (2023.01)
H10K 59/122 (2023.01)

(52) U.S. Cl.
CPC .......... H10K 59/126 (2023.02); H04N 23/57 (2023.01); H10K 50/80 (2023.02); H10K 50/86 (2023.02); H10K 50/865 (2023.02); H10K 59/38 (2023.02); H10K 59/65 (2023.02); H10K 59/122 (2023.02)

(58) Field of Classification Search
CPC ...... H10K 50/80; H10K 50/86; H10K 50/865; H10K 59/122; H10K 59/126; H10K 59/38; H10K 59/65; H04N 23/57
USPC .................................................. 257/440, 444
See application file for complete search history.

(56) References Cited

U.S. PATENT DOCUMENTS 11,641,750 B2 * 5/2023 Joei ................... H01L 27/14647
257/43

* cited by examiner

Primary Examiner — Hoai V Pham
(74) Attorney, Agent, or Firm — Birch, Stewart, Kolasch & Birch, LLP

(57) ABSTRACT

Discussed is a display device including a display panel that includes a substrate, a light shield layer disposed on the substrate, a light emitting element layer disposed on the light shield layer and including a plurality of subpixels, an encapsulation layer disposed on the light emitting element layer, and a polarizing layer disposed on the encapsulation layer, and a sensor disposed under the display panel. A display area of the display panel includes a main display area and a sensor area. The sensor is arranged to photoelectrically convert light received through the sensor area of the display panel, and the sensor area includes a radial pattern.

20 Claims, 19 Drawing Sheets

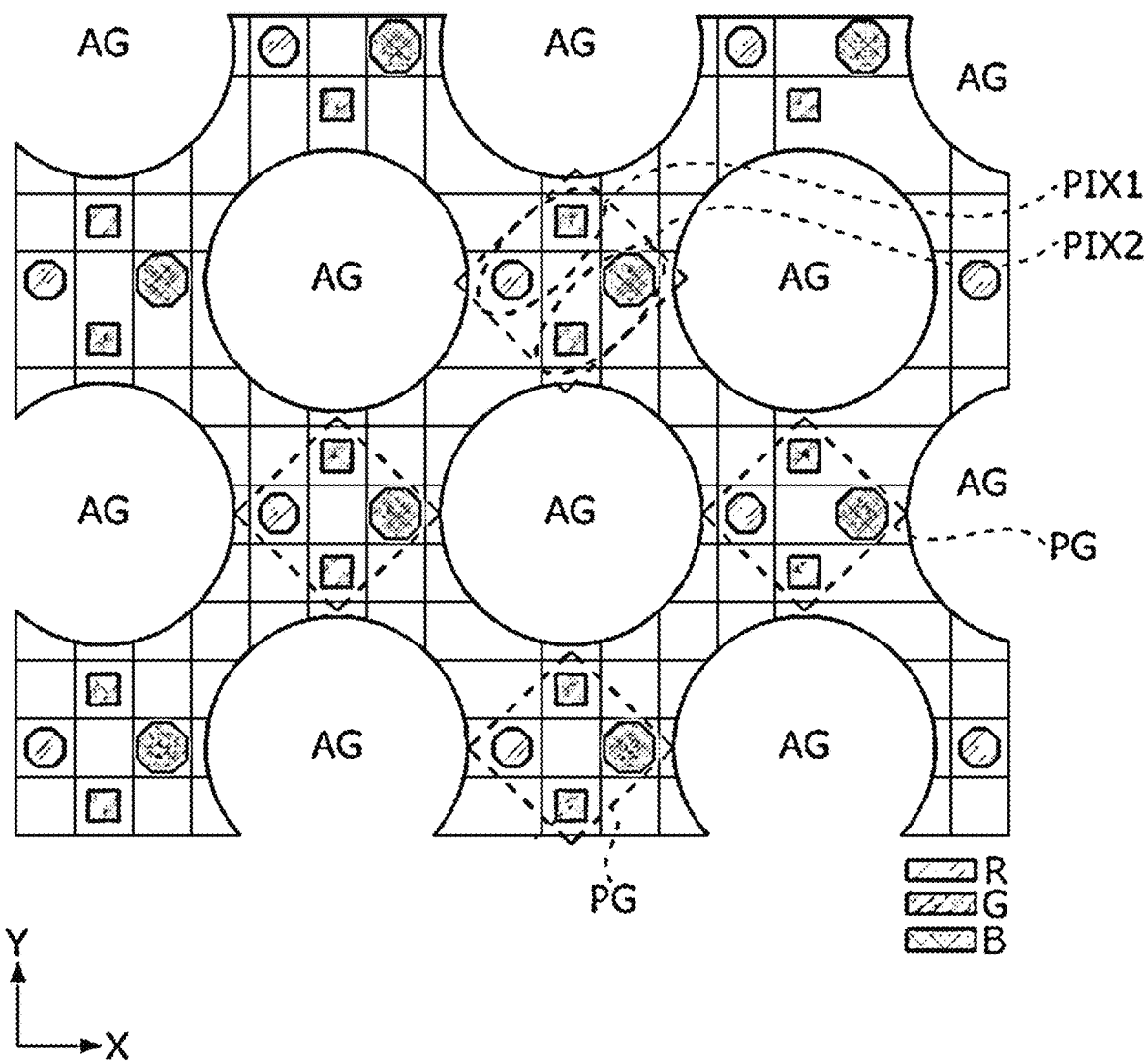

FIG. 9
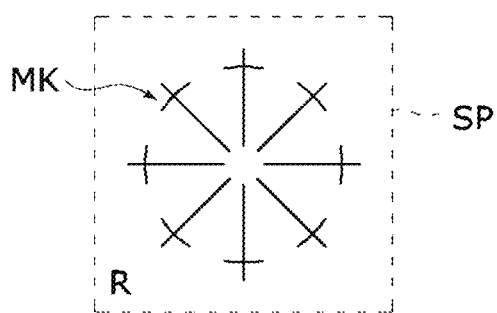
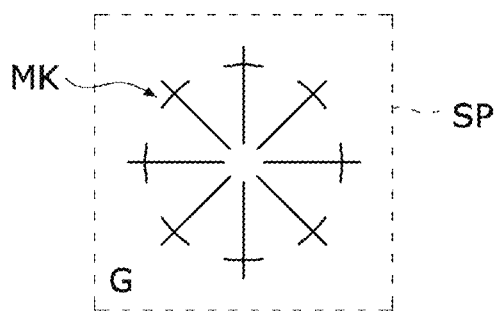
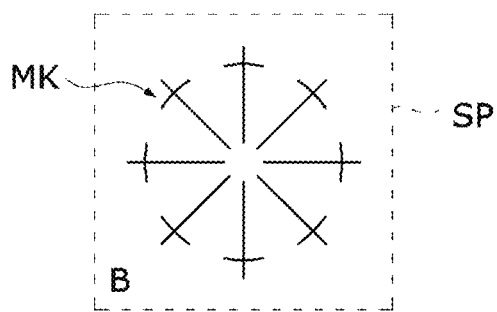

FIG. 11
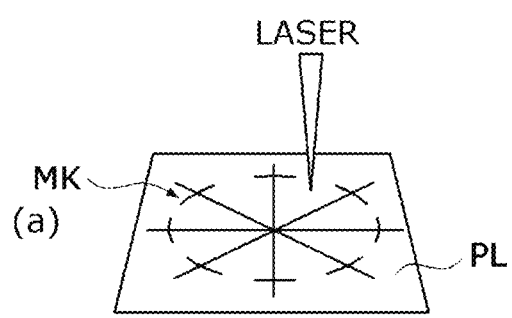
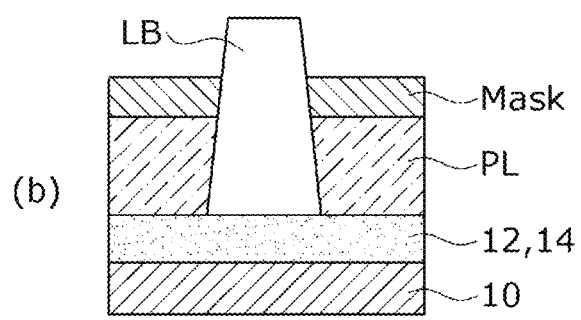

DISPLAY DEVICE HAVING A SENSOR DISPOSED UNDER THE DISPLAY PANEL

CROSS-REFERENCE TO RELATED APPLICATION

This application claims priority to and the benefit of Korean Patent Application No. 10-2020-0140818, filed in the Republic of Korea on Oct. 28, 2020, the entire contents of which are hereby expressly incorporated by reference into the present application.

BACKGROUND

1. Field

Embodiments of the present disclosure relate to a display device. More particularly, embodiments of the present disclosure relate to a display device in which a sensor is disposed under the display area.

2. Discussion of Related Art

Electroluminescent display devices are roughly classified into inorganic light emitting display devices and organic light emitting display devices depending on the material of the emission layer. The organic light emitting display device of an active matrix type includes an organic light emitting diode (hereinafter, referred to as "OLED") that emits light by itself. In the organic light emitting display device, the OLED is formed in each of a plurality of pixels. The organic light emitting display device has a fast response speed, is excellent in terms of luminous efficiency, luminance and viewing angle, and provides an excellent contrast ratio and color reproducibility since it can express black gradations in complete black.

Further, multimedia capabilities of mobile terminals have been improved. For example, smartphones are embedded with a camera by default, and the resolution of cameras is increasing to the level of existing digital cameras. However, the front camera of a smartphone restricts the screen design, making it difficult to design the screen. A screen design including a notch or punch hole has been adopted in the smartphone to reduce the space occupied by the camera, but the screen size can still be limited due to the camera, making it extremely difficult to implement a full-screen display.

To implement a full-screen display, a sensor area in which low-resolution pixels are arranged can be provided in the screen of the display panel. The sensor can be disposed under the sensor area. A plurality of layers are disposed on the path through which external light is incident to the sensor disposed under the sensor area. However, distortion may occur in the image captured by the sensor due to the multiple layers arranged on the optical path.

SUMMARY OF THE DISCLOSURE

An object of an embodiment of the present disclosure is to solve or address the aforementioned necessity and/or problem associated with the related art.

An object of an embodiment of the present disclosure is to provide a display device that implements a full-screen display and improves camera performance.

The problems of the related art are not limited to the problems mentioned above, and other problems not mentioned above will be clearly understood by those skilled in the art from the following description.

A display device according to an embodiment of the disclosure comprises a display panel that comprises a substrate, a light shield layer disposed on the substrate, a light emitting element layer disposed on the light shield layer and including a plurality of subpixels, an encapsulation layer disposed on the light emitting element layer, and a polarizing layer disposed on the encapsulation layer; and a sensor disposed under the display panel, wherein a display area of the display panel includes a main display area and a sensor area, wherein the sensor is arranged to photoelectrically convert light received through the sensor area of the display panel, wherein the sensor area includes a radial pattern.

The light emitting element layer can include a first electrode, a bank layer disposed on the first electrode to expose a portion of the first electrode, an organic compound layer disposed on the first electrode exposed by the bank layer, and a second electrode disposed on the organic compound layer. At least some of the light shield layer, a plurality of layers in the light emitting element layer, and the polarizing layer can include the radial pattern.

At least one of the light shield layer, the plurality of layers in the light emitting element layer, and the polarizing layer can include a linear pattern that passes through a center of the radial pattern and crosses the radial pattern.

The radial pattern can include circle patterns separated at an equal interval.

The radial pattern can be disposed on at least one of the light shield layer, the plurality of layers in the light emitting element layer, and the polarizing layer. The linear pattern can be disposed on at least one other layer separated from a layer on which the radial pattern is formed among the light shield layer, the plurality of layers in the light emitting element layer, and the polarizing layer.

The radial pattern can include a plurality of concentric circle patterns separated at an equal interval.

A display device according to another embodiment of the present disclosure comprises a display panel that comprises a substrate, a light shield layer disposed on the substrate, a light emitting element layer disposed on the light shield layer and including a plurality of subpixels, an encapsulation layer disposed on the light emitting element layer, a color filter layer disposed on the encapsulation layer, and a display area in which an adhesive layer disposed on the color filter layer is disposed; and a sensor disposed under the display panel, wherein the display area of the display panel includes a main display area and a sensor area, wherein the sensor is arranged to photoelectrically convert light received through the sensor area of the display panel, wherein the sensor area includes a radial pattern.

The light emitting element layer can include a first electrode, a black bank disposed on the first electrode to expose a portion of the first electrode, an organic compound layer disposed on the first electrode exposed by the black bank, and a second electrode disposed on the organic compound layer. The color filter layer can include color filters and a black matrix disposed between the color filters. At least one of the light shield layer, a plurality of layers in the light emitting element layer, the color filter layer, and the adhesive layer can include the radial pattern.

At least one of the light shield layer, the plurality of layers in the light emitting element layer, the color filter layer, and the adhesive layer can include a linear pattern that passes through a center of the radial pattern and crosses the radial pattern.

The radial pattern can include a circle patterns separated at an equal interval.

The radial pattern can be disposed on one or more of the light shield layer, the plurality of layers in the light emitting element layer, the color filter layer, and the adhesive layer. The linear pattern can be disposed on one or more other layers separated from the layer on which the radial pattern is formed among the light shield layer, the plurality of layers in the light emitting element layer, the color filter layer, and the adhesive layer.

The radial pattern can include a plurality of concentric circle patterns separated at an equal interval.

A display device according to another embodiment of the present disclosure comprises a display panel that comprises a substrate, a light shield layer disposed on the substrate, a light emitting element layer disposed on the light shield layer and including a plurality of subpixels, an encapsulation layer disposed on the light emitting element layer, a black matrix layer disposed on the encapsulation layer, and a display area in which a light absorption film disposed on the black matrix layer is disposed; and a sensor disposed under the display panel, wherein the display area of the display panel includes a main display area and a sensor area, wherein the sensor is arranged to photoelectrically convert light received through the sensor area of the display panel, wherein the sensor area includes a radial pattern.

The light emitting element layer can include a first electrode, a black bank disposed on the first electrode to expose a portion of the first electrode, an organic compound layer disposed on the first electrode exposed by the black bank, and a second electrode disposed on the organic compound layer. Further, at least one of the light shield layer, a plurality of layers in the light emitting element layer, the black matrix layer, and the light absorption film can include the radial pattern.

At least some of the light shield layer, the plurality of layers in the light emitting element layer, the black matrix layer, and the light absorption film can include a linear pattern that passes through a center of the radial pattern and crosses the radial pattern.

The radial pattern can include circle pattern separated at an equal interval.

The radial pattern can be disposed on at least one of the light shield layer, the plurality of layers in the light emitting element layer, the black matrix layer, and the light absorption film. Further, linear pattern can be disposed on at least one other layer separated from the layer on which the radial pattern is formed among the light shield layer, the plurality of layers in the light emitting element layer, the black matrix layer, and the light absorption film.

The radial pattern can include a plurality of concentric circle patterns separated at an equal interval.

The main display area can be adjacent to the sensor area, and a pixels-per-inch (PPI) of the main display area can be greater than a PPI of the sensor area.

In an embodiment, as the sensor is disposed in the screen on which an image is displayed, a screen of a full-screen display can be implemented.

In an embodiment, distortion of a captured image can be corrected by using a marker at the upper end of the sensor.

Various and beneficial advantages and effects of the present disclosure are not limited to those described above, and will be more easily understood from the detailed descriptions of specific embodiments of the present disclosure.

BRIEF DESCRIPTION OF THE DRAWINGS

The above and other objects, features, and advantages of the present disclosure will become more apparent to those of ordinary skill in the art by describing exemplary embodiments thereof in detail with reference to the attached drawings, in which:

FIG. 7 is a diagram illustrating an example of pixels and a light transmitting portion of the sensor area CA;

FIG. 9 is a diagram illustrating markers such as correction patterns, formed in units of subpixels according to an embodiment of the present disclosure;

FIG. 11 is a schematic diagram illustrating a method of forming a marker such as a correction pattern according to an embodiment of the present disclosure;

DETAILED DESCRIPTION OF THE EMBODIMENTS

Figure 1:
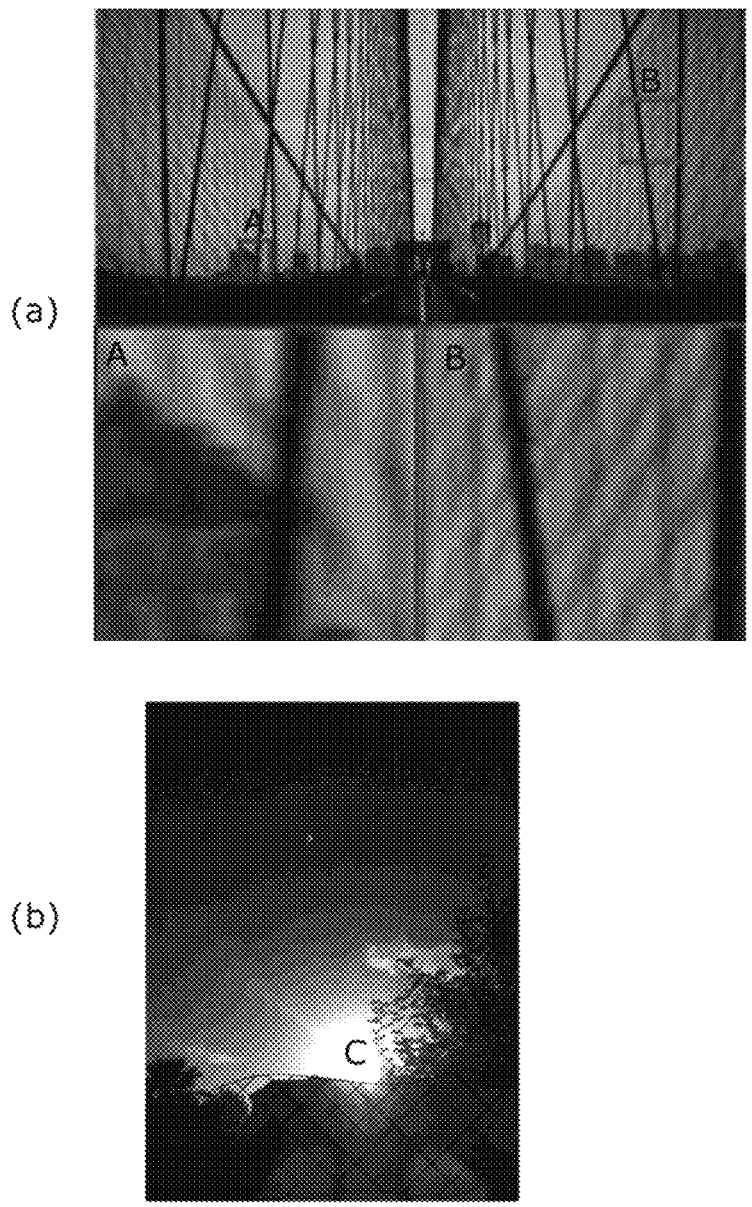
FIG. 1 is a diagram showing an example of deterioration in quality of a captured image.

FIG. 1 is a diagram showing an example of deterioration in quality of a captured image.

The display device according to an embodiment of the present disclosure can include a sensor under the display area. The sensor can include an imaging device as an embodiment. In this case, the optical path can be distorted due to a plurality of layers located on the imaging device, so that the image quality of the captured image can be deteriorated. With reference to FIG. 1, image distortion may occur such as a haze phenomenon as shown in part (a) of FIG. 1 or a halo phenomenon as shown in part (b) of FIG.

1. Accordingly, a display device including an imaging device under the display area may require image correction to improve the picture quality of a captured image.

Figure 2:
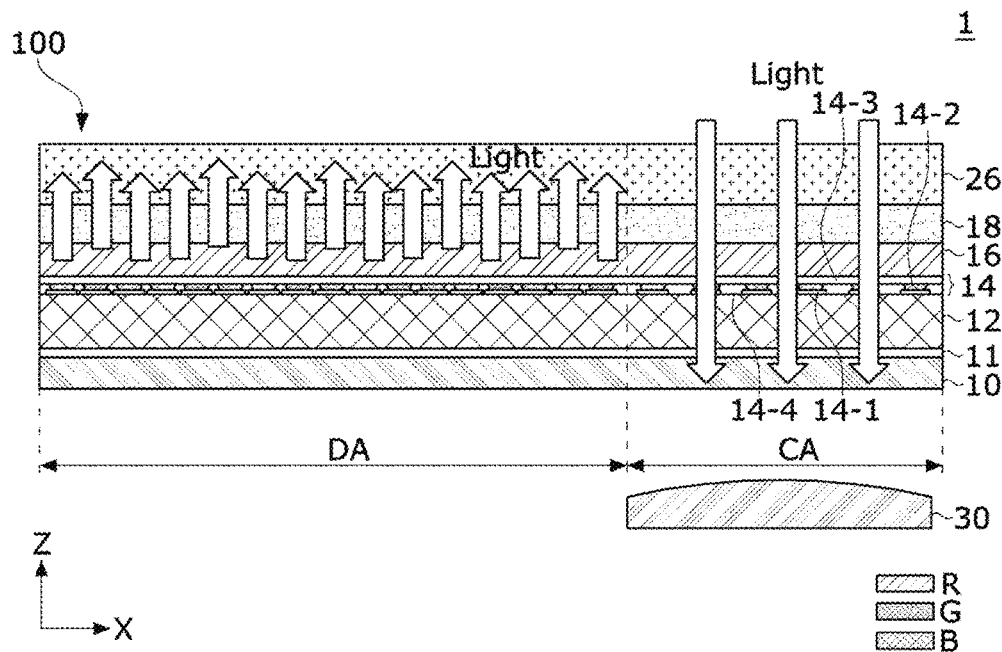
FIG. 2 is a schematic cross-sectional view of a display device according to a first embodiment of the present disclosure.

FIG. 2 is a schematic cross-sectional view of a display device according to a first embodiment of the present disclosure.

Figure 3:
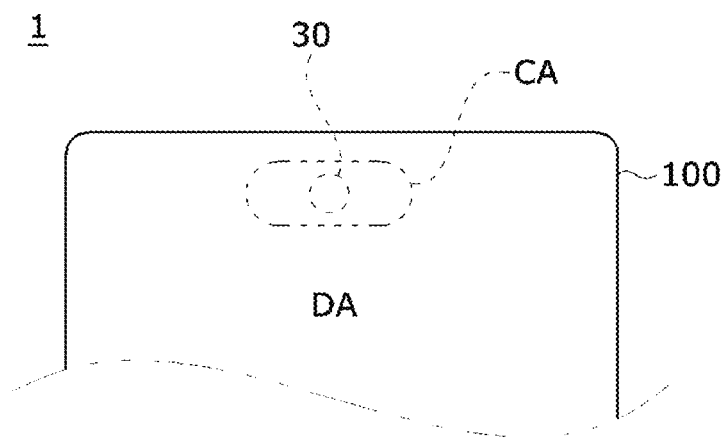
FIG. 3 is a plan view illustrating a sensor area and a part of a main display area in the display device according to an embodiment of the present disclosure.

FIG. 3 is a plan view illustrating the sensor area and a part of the main display area in the display device according to an embodiment of the present disclosure.

With reference to FIGS. 2 and 3, a display device 1 according to the first embodiment can include a display panel 100 and a sensor 30. The display panel 100 includes a display area for reproducing an input image. The display area can include a main display area DA and a sensor area CA having different resolutions.

Each of the main display area DA and the sensor area CA includes a pixel array in which pixels to which pixel data of an input image is written are arranged. The sensor area CA can be a lower resolution pixel area compared to the main display area DA. The pixel array of the main display area DA can include pixels arranged at a high pixels-per-inch (PPI). The pixel array of the sensor area CA can include pixels arranged at a low PPI.

As shown in FIG. 3, one or more sensor modules 30 facing the sensor area CA can be disposed under the display panel 100. For example, the sensor module 30 can include one or more of sensors that convert light received through the sensor area CA into an electrical signal (photoelectric conversion), such as an imaging module including an image sensor, an infrared sensor module, and an illuminance sensor module. The sensor module 30 can be separated for each sensor and divided into a plurality of modules. The sensor module 30 can be disposed under the sensor area CA of the display panel 100. The sensor area CA can include a light transmitting portion to increase the transmittance of light directed to the sensor module.

Since the main display area DA and the sensor area CA include pixels, the input image can be displayed on the main display area DA and the sensor area CA.

Each of the pixels in the main display area DA and the sensor area CA includes subpixels having different colors to implement an image color. The subpixels include a red subpixel (hereinafter referred to as "R subpixel"), a green subpixel (hereinafter referred to as "G subpixel"), and a blue subpixel (hereinafter referred to as "B subpixel"). Each of the pixels P can further include a white subpixel (hereinafter referred to as "W subpixel"). Each of the subpixels can include a pixel circuit driving a light emitting element.

An image quality compensation algorithm can be applied to compensate the luminance and color coordinates of pixels in the sensor area CA having a lower PPI compared with the main display area DA.

In the display device according to an embodiment of the present disclosure, as pixels are arranged in the sensor area CA where the sensor is disposed, the display area of the screen is not limited due to an imaging module such as a camera. Accordingly, the display device of the present disclosure can implement the screen of a full-screen display.

The display panel 100 according to the first embodiment of the present disclosure has a width in the X-axis direction, a length in the Y-axis direction, and a thickness in the Z-axis direction. The display panel 100 can include a light shield layer 11 disposed on the substrate 10, a circuit layer 12 disposed on the light shield layer 11, and a light emitting element layer 14 disposed on the circuit layer 12 on the light shield layer 11. An encapsulation layer 16 can be disposed on the light emitting element layer 14. A polarizing plate 18 can be disposed on the encapsulation layer 16, and a cover glass 26 can be disposed on the polarizing plate 18.

The light shield layer 11 can be configured to protect and stabilize a switching transistor, a driving transistor, and a sensing transistor. To this end, the light shield layer 11 can serve to block light incident to the circuit layer 12 including a plurality of transistors.

The circuit layer 12 can include a pixel circuit connected to wires such as data lines, gate lines, and power lines, and a gate driver connected to the gate lines. The circuit layer 12 can include circuit elements such as transistors implemented with thin film transistors (TFTs) and capacitors. The wires and circuit elements of the circuit layer 12 can be implemented with a plurality of insulating layers, two or more metal layers separated with an insulating layer therebetween, and an active layer including a semiconductor material.

The light emitting element layer 14 can include a light emitting element driven by a pixel circuit. The light emitting element can be implemented with an OLED. The OLED can include an organic compound layer 14-2 formed between a first electrode 14-1 and a second electrode 14-3. More specifically, a bank 14-4 can be disposed on the first electrode 14-1. The bank 14-4 can expose at least a part of the first electrode 14-1. The organic compound layer 14-2 can be disposed on the first electrode 14-1 exposed by the bank 14-4. The second electrode 14-3 can be disposed as, but not limited to, a common layer on the organic compound layer 14-2. In one embodiment, the first electrode 14-1 and the second electrode 14-3 can be, but not limited to, an anode and a cathode, respectively.

The organic compound layer 14-2 can include, but not limited to, a hole injection layer (HIL), a hole transport layer (HTL), an emission layer (EML), an electron transport layer (ETL), and an electron injection layer (EIL). When voltage is applied to the anode and cathode of the OLED, holes passing through the hole transport layer (HTL) and electrons passing through the electron transport layer (ETL) move to the emission layer (EML) to form excitons, so that visible light is emitted from the emission layer (EML). The light emitting element layer 14 can be disposed on pixels that selectively transmit red, green, and blue wavelengths, and can further include a color filter array.

The light emitting element layer 14 can be covered with a protective film, and the protective film can be covered with the encapsulation layer 16. The passivation layer and the encapsulation layer 16 can have a structure in which an organic film and an inorganic film are alternately stacked. The inorganic film blocks the penetration of moisture or oxygen. The organic film planarizes the surface of the inorganic film. When organic and inorganic films are stacked in multiple layers, the movement path of moisture or oxygen becomes longer compared with a single layer, so that the penetration of moisture/oxygen affecting the light emitting element layer 14 can be effectively blocked.

The polarizing plate 18 can be adhered to the encapsulation layer. The polarizing plate 18 improves outdoor visibility of the display device. The polarizing plate 18 reduces light reflected from the surface of the display panel 100 and blocks light reflected from the metal of the circuit layer 12 to thereby improve the brightness of pixels. The polarizing plate 18 can be implemented as a polarizing plate or circular polarizing plate in which a linear polarizing plate and a phase retardation film are bonded. The cover window 26 can be attached on the polarizing plate 18.

In the sensor area CA, when external light is incident to the sensor 30, there can occur a difference in optical paths of red light, blue light, and green light due to a difference in refractive index. Thereby, distortion can occur in the image. To correct this, it is possible to form a marker on a specific layer located in the sensor area CA and use the same. The marker can be a correction pattern formed on a specific layer. The layer on which such a correction pattern is formed is collectively referred to as a pattern layer. The pattern layer can be the light shield layer 11, the second electrode layer 14-3, and the polarizing plate 18. Correction patterns formed on individual pattern layers can be different, and a correction pattern can be formed in, but not limited to, some of these layers only. A detailed shape of the correction pattern and a correction (or compensation) method using the same will be described later.

Figure 4:
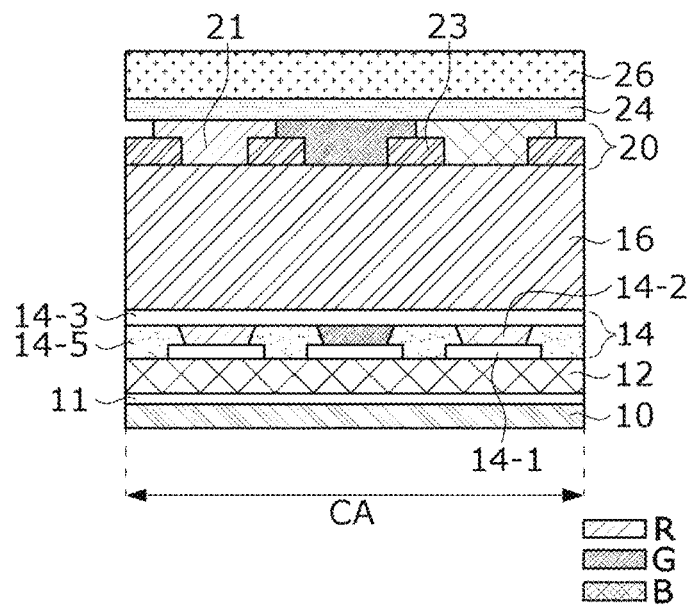
FIG. 4 is a diagram illustrating a sensor area of a display panel according to a second embodiment of the present disclosure.

FIG. 4 is a diagram illustrating a sensor area of the display panel according to a second embodiment of the present disclosure.

With reference to FIG. 4, the sensor area CA of the display panel 100 according to the second embodiment of the present disclosure will be described. Configurations that are substantially the same as those of the first embodiment are denoted by the same reference symbols, and the differences will be mainly described.

In the sensor area CA, the display panel 100 can include a substrate 10, a light shield layer 11 disposed on the substrate 10, a circuit layer 12 disposed on the light shield layer 11, a light emitting element layer 14 disposed on the circuit layer 12, an encapsulation layer 16 disposed on the light emitting element layer 14, a color filter layer 20 disposed on the encapsulation layer, an adhesive layer 24 disposed on the color filter layer 20, and a cover window 26 disposed on the adhesive layer 24.

The light emitting element layer 14 can include a light emitting element driven by a pixel circuit. The light emitting element can be implemented with an OLED. The OLED can include an organic compound layer 14-2 formed between a first electrode 14-1 and a second electrode 14-3. More specifically, a black bank 14-5 can be disposed on the first electrode 14-1. The black bank 14-5 can include a material capable of absorbing light, for example, a black dye. The black bank 14-5 absorbs light traveling from a specific subpixel SP to a neighboring subpixel SP, thereby preventing color mixing between adjacent subpixels SP. The black bank 14-5 can expose at least a part of the first electrode 14-1. The organic compound layer 14-2 can be disposed on the first electrode 14-1 exposed by the black bank 14-5. The second electrode 14-3 can be disposed as, but not limited to, a common layer on the organic compound layer 14-2. In one embodiment, the first electrode 14-1 and the second electrode 14-3 can be, but not limited to, an anode and a cathode, respectively.

The color filter layer 20 can include a black matrix 23 disposed between a color filter 21 and a color filter 21. The color filter 21 can transmit light of a specific color and can absorb light of other colors. In other words, the color filter 21 can transmit light in a specific wavelength range and can absorb light in other wavelength ranges. Each color filter 21 can include a red pigment, a green pigment, or a blue pigment. The color filter 21 including a red pigment can transmit a color in the red wavelength range. The color filter 21 including a green pigment can transmit a color in the green wavelength range. The color filter 21 including a blue pigment can transmit a color in the blue wavelength range. The black matrix 23 can separate the space between the color filters 21 and absorb light that travels between the neighboring color filters 21 to thereby prevent color mixture from occurring.

The adhesive layer 24 can adhere the cover window 26 to the display panel. The adhesive layer 24 can include a black adhesive to prevent light leakage.

In the sensor area CA, when external light is incident to the sensor 30, there can occur a difference in optical paths of red light, blue light, and green light due to a difference in refractive index. Thereby, distortion can occur in the image. To correct this, it is possible to form a marker on a specific layer located in the sensor area CA and use the same. The marker can be a correction pattern formed on a specific layer. The layer in which such a correction pattern is formed is referred to as a pattern layer. The pattern layer can include the light shield layer 11, the second electrode layer 14-3, the light emitting element layer 14, the color filter layer 20, and the adhesive layer 24. More specifically, the marker can be formed on the light shield layer 11, the second electrode layer 14-3, the black bank 14-5 of the light emitting element layer 14, the color filter 21 and the black matrix 23 of the color filter layer 20, and the adhesive layer 24. Correction patterns formed on individual pattern layers can be different, and a correction pattern can be formed in, but not limited to, some of these layers only. A detailed shape of the correction pattern and a correction (or compensation) method using the same will be described later.

Figure 5:
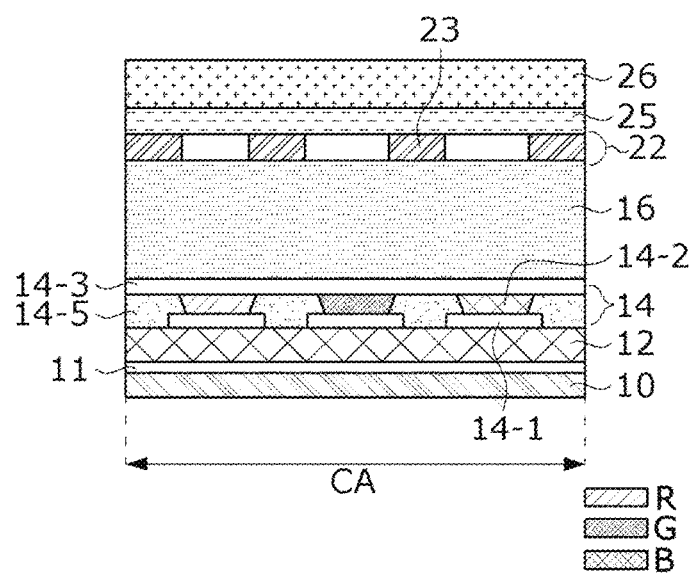
FIG. 5 is a diagram illustrating a sensor area of a display panel according to a third embodiment of the present disclosure.

FIG. 5 is a diagram illustrating a sensor area of the display panel according to a third embodiment of the present disclosure.

With reference to FIG. 5, the sensor area CA of the display panel 100 according to the third embodiment of the present disclosure will be described. Configurations that are substantially the same as those of the first embodiment are denoted by the same reference symbols, and the differences will be mainly described.

In the sensor area CA, the display panel 100 can include a substrate 10, a light shield layer 11 disposed on the substrate 10, a circuit layer 12 disposed on the light shield layer 11, a light emitting element layer 14 disposed on the circuit layer 12, an encapsulation layer 16 disposed on the light emitting element layer 14, a black matrix layer 22 disposed on the encapsulation layer, a light absorption film 25 disposed on the black matrix layer 22, and a cover window 26 disposed on the light absorption film 25.

The light emitting element layer 14 can include a light emitting element driven by a pixel circuit. The light emitting element can be implemented with an OLED. The OLED can include an organic compound layer 14-2 formed between a first electrode 14-1 and a second electrode 14-3. More specifically, a black bank 14-5 can be disposed on the first electrode 14-1. The black bank 14-5 can include a material capable of absorbing light, for example, a black dye. The black bank 14-5 absorbs light traveling from a specific subpixel SP to a neighboring subpixel SP, thereby preventing color mixture between adjacent subpixels SP from occurring. The black bank 14-5 can expose at least a part of the first electrode 14-1. The organic compound layer 14-2 can be disposed on the first electrode 14-1 exposed by the black bank 14-5. The second electrode 14-3 can be disposed as, but not limited to, a common layer on the organic compound layer 14-2. In one embodiment, the first electrode 14-1 and the second electrode 14-3 can be, but not limited to, an anode and a cathode, respectively.

The black matrix layer 22 can include a plurality of black matrixes 23. The black matrix 23 can be disposed between subpixels. The black matrix 23 can prevent color mixing between neighboring subpixels.

The light absorption film 25 disposed on the black matrix layer 22 plays a similar role to the color filter of the second embodiment described above, but can absorb light of a sharper range compared with a regular color filter. The light absorbing layer 25 can absorb a sharp range at the boundaries of red/green/blue color spectrum.

In the sensor area CA, when external light is incident to the sensor 30, there may occur a difference in optical paths of red light, blue light, and green light due to a difference in refractive index. Thereby, distortion may occur in the image. To correct this, it is possible to form a marker on a specific layer located in the sensor area CA and use the same. The marker can be a correction pattern formed on a specific layer. The layer in which such a correction pattern is formed is referred to as a pattern layer. The pattern layer can include the light shield layer 11, the second electrode layer 14-3, the light emitting element layer 14, the black matrix layer 22, and the light absorption film 25. Correction patterns formed on individual pattern layers can be different, and a correction pattern can be formed in, but not limited to, some of these layers only. A detailed shape of the correction pattern and a correction (or compensation) method using the same will be described later.

Figure 6:
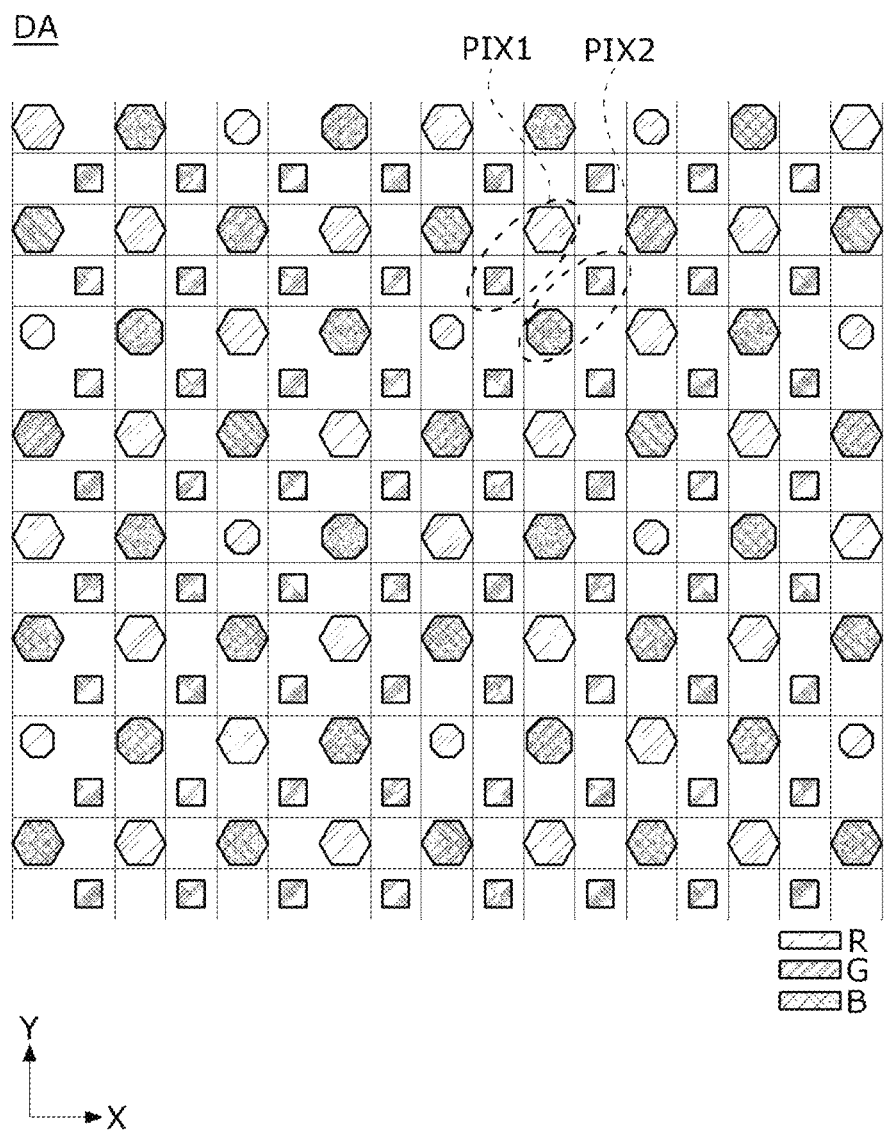
FIG. 6 is a diagram illustrating an example of pixel arrangement in the main display area DA.

FIG. 6 is a diagram illustrating an example of pixel arrangement in the main display area DA.

FIG. 7 is a diagram illustrating an example of pixels and a light transmitting portion of the sensor area CA.

In FIGS. 6 and 7, wires connected to the pixels are omitted for improved viewing of the display area DA and the sensor area CA.

Next, a description is given of arrangement of pixels in the display device according to an embodiment of the present disclosure with reference to FIGS. 6 and 7.

With reference to FIG. 6, the main display area DA includes pixels PIX1 and PIX2 arranged at a high PPI. Each of the pixels PIX1 and PIX2 can be implemented as a real type pixel in which R, G and B subpixels of three primary colors are formed as one pixel. Each of the pixels PIX1 and PIX2 may further include a W subpixel omitted from the drawing. In addition, two subpixels can be configured as one pixel by using a subpixel rendering algorithm. For example, using a pixel rendering algorithm, the first pixel PIX1 can be composed of R and G subpixels, and the second pixel PIX2 can be composed of B and G subpixels. The pixel rendering algorithm can compensate for an insufficient color expression in each of the pixels PIX1 and PIX2 with an average value of corresponding color data between neighboring pixels.

With reference to FIG. 7, the sensor area CA includes light transmitting portions AG disposed between neighboring pixel groups PG spaced apart by a preset distance. External light is received by the lens of the sensor module through the light transmitting portions AG. The light transmitting portions AG can include transparent media having high transmittance without metal so that light can be incident with minimal light loss. In other words, the light transmitting portions AG can be made of transparent insulating materials without including metal lines or pixels. The PPI of the sensor area CA can be smaller than that of the main display area DA due to the light transmitting portions AG.

One pixel group PG of the sensor area CA can include one or two pixels. Each of the pixels of the pixel group can include two to four subpixels. For example, one pixel in the pixel group can include R, G and B subpixels or two subpixels, and can further include one W subpixel. In the example of FIG. 7, the first pixel PIX1 and the second pixel PIX2 are respectively composed of, but not limited to, R and G subpixels and B and G subpixels.

In FIG. 7, the shape of the light transmitting portions AG is illustrated as being circular, but without being limited thereto. For example, the light transmitting portions AG can be designed in various shapes such as a circle, an ellipse, and a polygon.

Figure 8A:
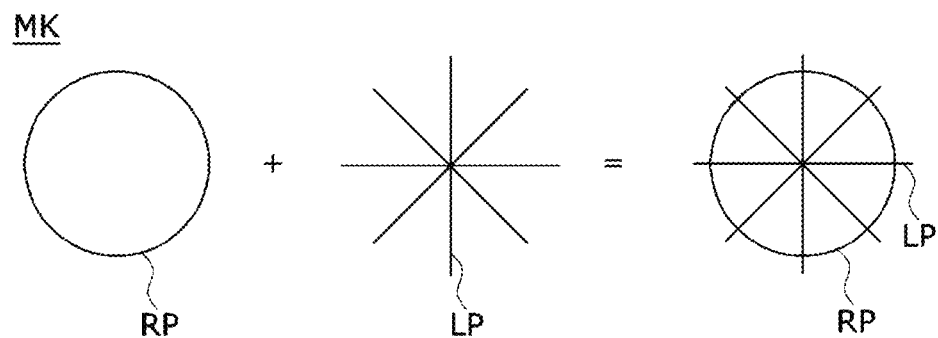
FIGS. 8A, 8B and 8C are diagrams showing the shape of a marker according to an embodiment of the present disclosure.
Figure 8B:
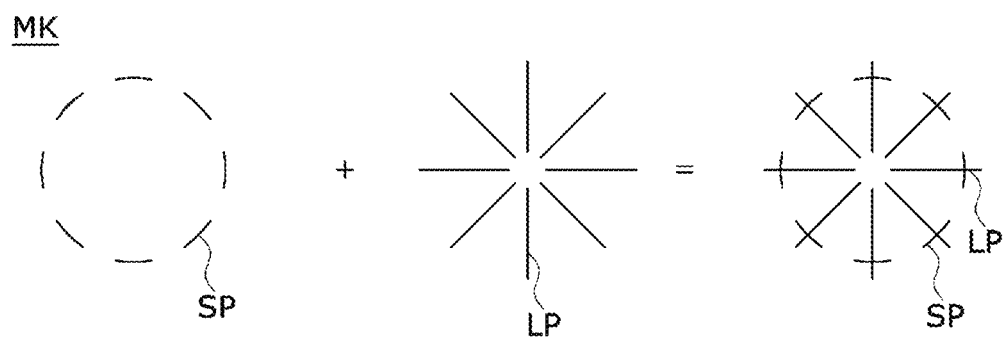
Figure 8C:
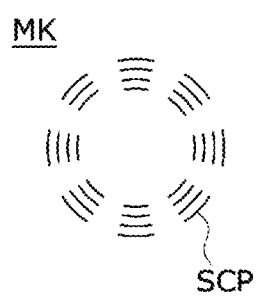

FIGS. 8A to 8C are diagrams showing the shape of a marker according to an embodiment of the present disclosure.

Next, a description is given of a specific shape of the marker according to an embodiment of the present disclosure with reference to FIGS. 8A to 8C. The specific shape of the marker described below is only an illustration and is not limited thereto.

With reference to FIG. 8A, a marker (MK), that is, a correction pattern MK according to an embodiment of the present disclosure can include a radial pattern. Specifically, the radial pattern can include a circular radial pattern RP and a linear patterns LP. More specifically, the correction pattern MK can include a circular radial pattern RP and a linear patterns LP extending from the center of the circle to the outside of the circle. The linear patterns LP can cross the circular radial pattern RP. The adjacent linear patterns LP can form the same angle with each other.

The circular radial pattern RP and the linear patterns LP can be separately formed on different layers. The circular radial pattern RP and the linear patterns LP separately formed on different layers can overlap when viewed from the upper surface of the display device. For example, when viewed from the upper surface of the display device, an overlap pattern of the circular radial pattern RP and the linear patterns LP can be formed as shown in the right part of FIG. 8A.

In the case of the first embodiment, the different layers on which the circular radial pattern RP and the linear patterns LP can be formed can include the light shield layer 11, the second electrode layer 14-3, and the polarizing plate 18 as described above with reference to FIG. 2. For example, the circular radial pattern RP can be formed on the light shield layer 11, and the linear patterns LP can be formed on the polarizing plate 18 overlapping vertically therewith. As another example, the linear patterns LP can be formed on the light shield layer 11, and the circular radial patterns RP can be formed on the polarizing plate 18 overlapping vertically therewith. As another example, the circular radial pattern RP can be formed on the second electrode layer 14-3, and the linear patterns LP can be formed on the polarizing plate 18 overlapping vertically therewith. As another example, the linear patterns LP can be formed on the second electrode layer 14-3, and the circular radial pattern RP can be formed on the polarizing plate 18 overlapping vertically therewith.

In the case of the second embodiment, for example, the circular radial pattern RP can be formed on the light shield layer 11 or the second electrode layer 14-3, and the linear patterns LP can be formed on the adhesive layer 24, the black matrix 23, the color filter 21, or the black bank 14-5. As another example, the linear patterns LP can be formed on the light shield layer 11 or the second electrode layer 14-3, and the circular radial pattern RP can be formed on the adhesive layer 24, the black matrix 23, the color filter 21, or the black bank 14-5.

In the case of the third embodiment, for example, the circular radial pattern RP can be formed on the light shield layer 11 or the second electrode layer 14-3, and the linear patterns LP can be formed on the black bank 14-5, the black matrix layer 22, or the light absorption film 25. As another example, the linear patterns LP can be formed on the light shield layer 11 or the second electrode layer 14-3, and the circular radial pattern RP can be formed on the black bank 14-5, the black matrix layer 22, or the light absorption film 25.

With reference to FIG. 8B, a marker (MK), that is, a correction pattern MK according to an embodiment of the present disclosure can include a radial pattern. Specifically, the radial pattern can include circle patterns SP separated at an equal interval and linear patterns LP. The linear patterns LP can include linear patterns LP extending from the center of the circle patterns SP to the outside of the circle. The linear patterns LP can cross the circle patterns SP. The adjacent linear patterns LP can form the same angle with each other. The linear patterns LP can be broken near the center of the circle patterns SP. That is, as shown in FIG. 8B, the linear patterns can be broken near the center of the circle patterns SP, and when the broken linear patterns LP are extended toward the center of the circle patterns SP, they can meet at the center of the circle patterns SP.

The circle patterns SP and the linear patterns LP can be separately formed on different layers. The circle patterns SP and the linear patterns LP formed on different layers can overlap when viewed from the upper surface of the display device. For example, when viewed from the upper surface of the display device, as shown in the right part of FIG. 8B, an overlap pattern of the circle patterns SP and the linear patterns LP can be formed.

In the case of the first embodiment, the different layers on which the circle patterns SP and the linear patterns LP can be formed can include the light shield layer 11, the second electrode layer 14-3, and the polarizing plate 18 as described above with reference to FIG. 2. For example, the circle patterns SP can be formed on the light shield layer 11, and the linear patterns LP can be formed on the polarizing plate 18 overlapping vertically therewith. As another example, the linear patterns LP can be formed on the light shield layer 11, and the circle patterns SP can be formed on the polarizing plate 18 overlapping vertically therewith. As another example, the circle patterns SP can be formed on the second electrode layer 14-3, and the linear patterns LP can be formed on the polarizing plate 18 overlapping vertically therewith. As another example, the linear patterns LP can be formed on the second electrode layer 14-3, and the circle patterns SP can be formed on the polarizing plate 18 overlapping vertically therewith.

In the case of the second embodiment, for example, the circle patterns SP can be formed on the light shield layer 11 or the second electrode layer 14-3, and the linear patterns LP can be formed on the adhesive layer 24, the black matrix 23, the color filter 21, or the black bank 14-5. As another example, the linear patterns LP can be formed on the light shield layer 11 or the second electrode layer 14-3, and the circle patterns SP can be formed on the adhesive layer 24, the black matrix 23, the color filter 21, or the black bank 14-5.

In the case of the third embodiment, for example, the circle patterns SP can be formed on the light shield layer 11 or the second electrode layer 14-3, and the linear patterns LP can be formed on the light shield layer 11, the second electrode layer 14-3, the black bank 14-5, the black matrix layer 22, or the light absorption film 25. As another example, the linear patterns LP can be formed on the light shield layer 11 or the second electrode layer 14-3, and the circle patterns SP can be formed on the black bank 14-5, the black matrix layer 22, or the light absorption film 25.

With reference to FIG. 8C, a marker (MK), that is, a correction pattern MK according to an embodiment of the present disclosure can include a radial pattern. More specifically, the radial pattern can include a plurality of concentric circle patterns SCP. In addition, as shown in FIG. 8C, each of the plural concentric circle patterns SCP can be the circle patterns separated at an equal interval.

In the case of the display device according to the first embodiment, the plural concentric circle patterns SCP shown in FIG. 8C can be formed on the light shield layer 11, the second electrode layer 14-3, or the polarizing plate 18. In the case of the display device according to the second embodiment, the plural concentric circle patterns SCP can be formed on the adhesive layer 24, the black matrix 23, the color filter 21, or the black bank 14-5. In the case of the display device according to the third embodiment, the plural concentric circle patterns SCP can be formed on the light shield layer 11, the second electrode layer 14-3, the black bank 14-5, the black matrix layer 22, or the light absorption film 25.

FIG. 9 is a diagram illustrating markers, that is, correction patterns, formed in units of subpixels according to an embodiment of the present disclosure.

Figure 10:
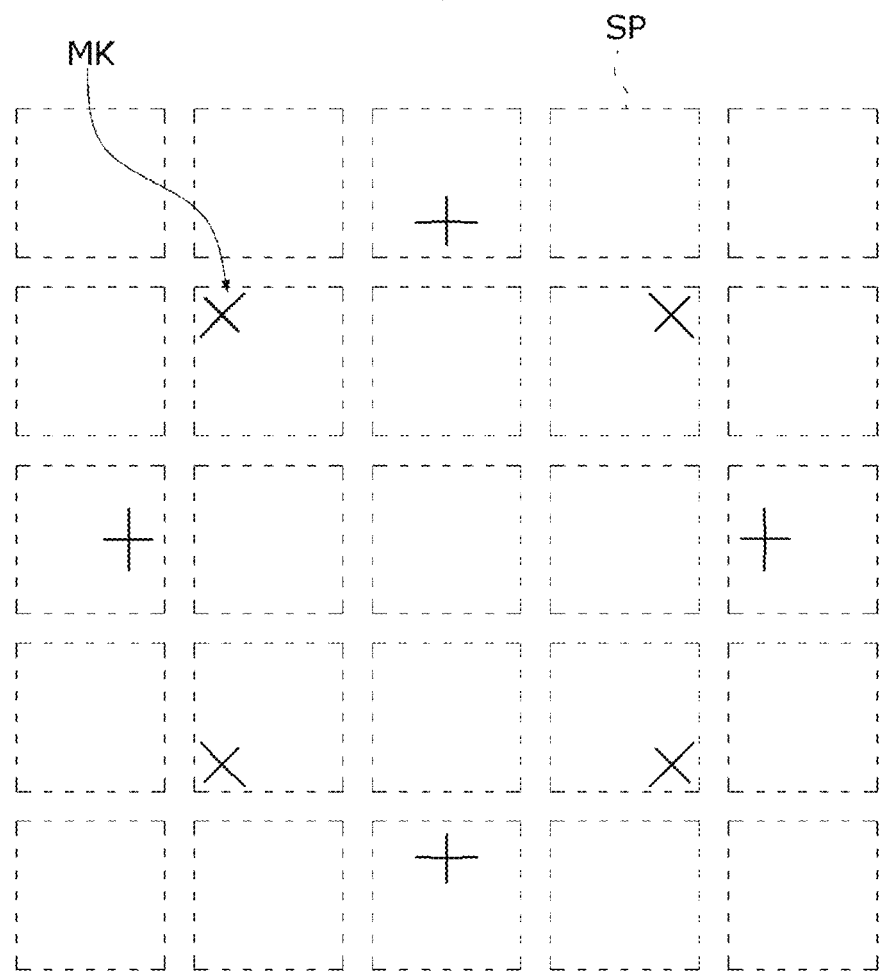
FIG. 10 is a diagram illustrating markers such as correction patterns, formed in units of a plurality of subpixels according to an embodiment of the present disclosure.

FIG. 10 is a diagram illustrating markers, that is, correction patterns, formed in units of a plurality of subpixels according to an embodiment of the present disclosure.

With reference to FIG. 9, the marker, that is, the correction pattern can be fabricated to correspond to the size of one subpixel SP. For example, the marker can be formed to correspond to the size of one of the red (R), green (G), and blue (B) subpixels SP.

Unlike this, with reference to FIG. 10, the marker MK, that is, the correction pattern can be formed to correspond to a size accommodating a plurality of subpixels SP. The number of subpixels SP corresponding to one correction pattern can be 25 as shown in FIG. 10, but can be appropriately adjusted as necessary without being limited thereto.

FIG. 11 is a schematic diagram illustrating a method of forming a marker, that is, a correction pattern according to an embodiment of the present disclosure.

As shown in (a) of FIG. 11, the marker MK, that is, the correction pattern MK, can be formed by irradiating a laser on the pattern layer PL on which the pattern is to be formed and cutting it. Alternatively, as shown in (b) of FIG. 11, after stacking a circuit layer 12 and a light emitting element layer 14 on the substrate 10 and then stacking a pattern layer PL (e.g., polarizing plate 18) on which a pattern is to be formed on the circuit layer 12 and the light emitting element layer 14, a mask MASK is formed on the pattern layer PL (e.g., polarizing plate 18), and then an exposure laser beam LB is irradiated through an opening region of the mask MASK to form the marker MK. Through this method, the marker MK can be formed as an intaglio pattern or a relief pattern. However, without being limited to the above method, any method can be used as long as it is capable of forming such a marker MK.

Next, a description is given of a process for the display device to correct a captured image by using a marker according to an embodiment of the present disclosure with reference to FIGS. 12 to 15.

Figure 12:
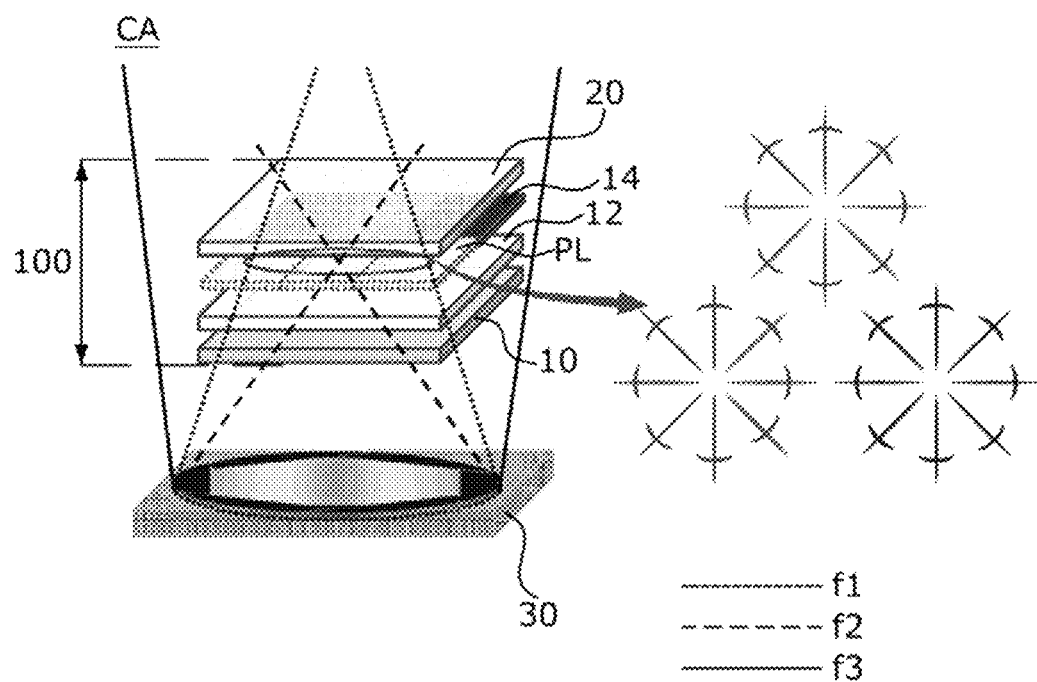
FIG. 12 is a diagram schematically illustrating a situation in which the display device takes a close-up picture of a marker according to an embodiment of the present disclosure.

FIG. 12 is a diagram schematically illustrating a situation in which the display device takes a close-up picture of a marker according to an embodiment of the present disclosure.

Figure 13:
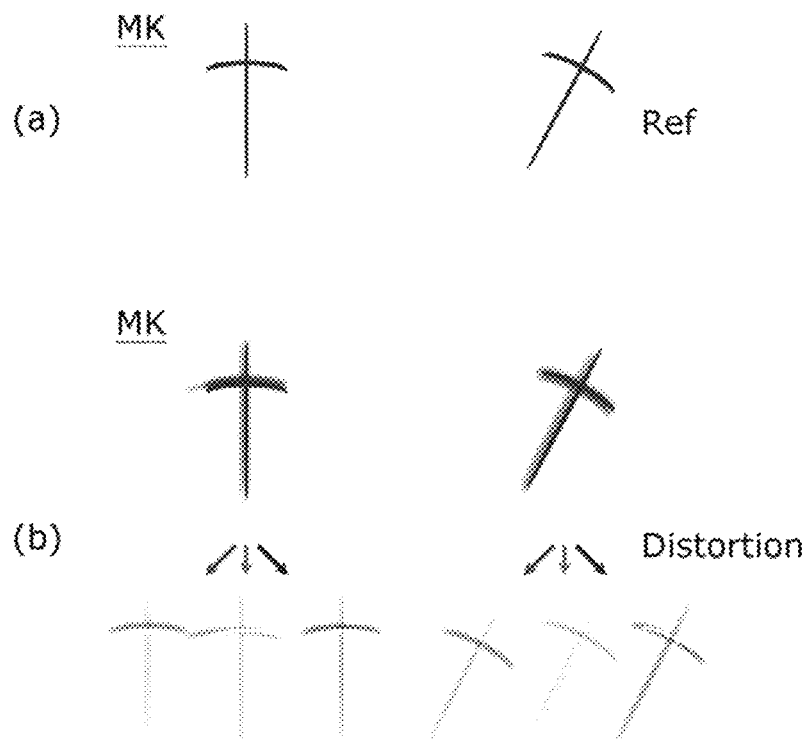
FIG. 13 illustrates an image obtained by photographing the marker.

FIG. 13 illustrates an image obtained by photographing the marker.

FIG. 12 is a schematic diagram illustrating close-up photographing of a marker in the display device. With reference to FIG. 12, the display device according to an embodiment can include a display panel 100 and a sensor 30. The sensor 30 can be located under the sensor area CA of the display panel 100. For example, the sensor 30 can be an imaging device such as a camera. The display panel 100 can include a substrate 10, a circuit layer 12, a light emitting element layer 14, a pattern layer PL on which a marker MK is formed, and a cover window 26. As described above, the pattern layer PL can include the light shield layer 11, the second electrode layer 14-3, the polarizing plate 18, the black bank 14-5, the color filter layer 20, the adhesive layer 24, or the light absorption film 25 according to the configuration of the display panel 100.

Hereinafter, the sensor 30 will be described as an example of an imaging device. The display device according to an embodiment of the present disclosure can generate correction data before the sensor 30 photographs a subject (or target). The correction data can be generated by, but not limited to, the sensor driver 600 shown in FIG. 16. To generate correction data, the sensor 30 can take extreme close-up photographs f1 and f2 of the marker MK formed on the pattern layer PL. The extreme close-up photographs f1 and f2 of the marker MK can be taken at a step where the sensor 30 focuses before photographing the subject (or target). After taking the extreme close-up photographs f1 and f2 of the marker MK, the subject photographing f3 can be performed.

Here, part (a) of FIG. 13 illustrates a reference image Ref of the marker MK. The reference image of the marker MK can be an ideal image stored in advance.

Further, part (b) of FIG. 13 illustrates an actual image taken when the marker MK is photographed in an extreme close-up. As shown in part (b) of FIG. 13, the actually captured image can be input after being distorted according to external light conditions. To correct this, after separating the distorted image for each color (R, G, B), correction data can be generated for each color.

The image can be corrected (or compensated) by comparing the value obtained by performing fast Fourier transform (FFT) of the reference image of the marker MK in part (a) of FIG. 13 with the value obtained by performing fast Fourier transform (FFT) of the distorted image for each color of the marker MK in part (b) of FIG. 13. More specifically, the image can be corrected (or compensated) in such a way that distorted values are filtered from the fast Fourier transform (FFT) value of the reference image in the fast Fourier transform (FFT) value of the distorted image.

Figure 14:
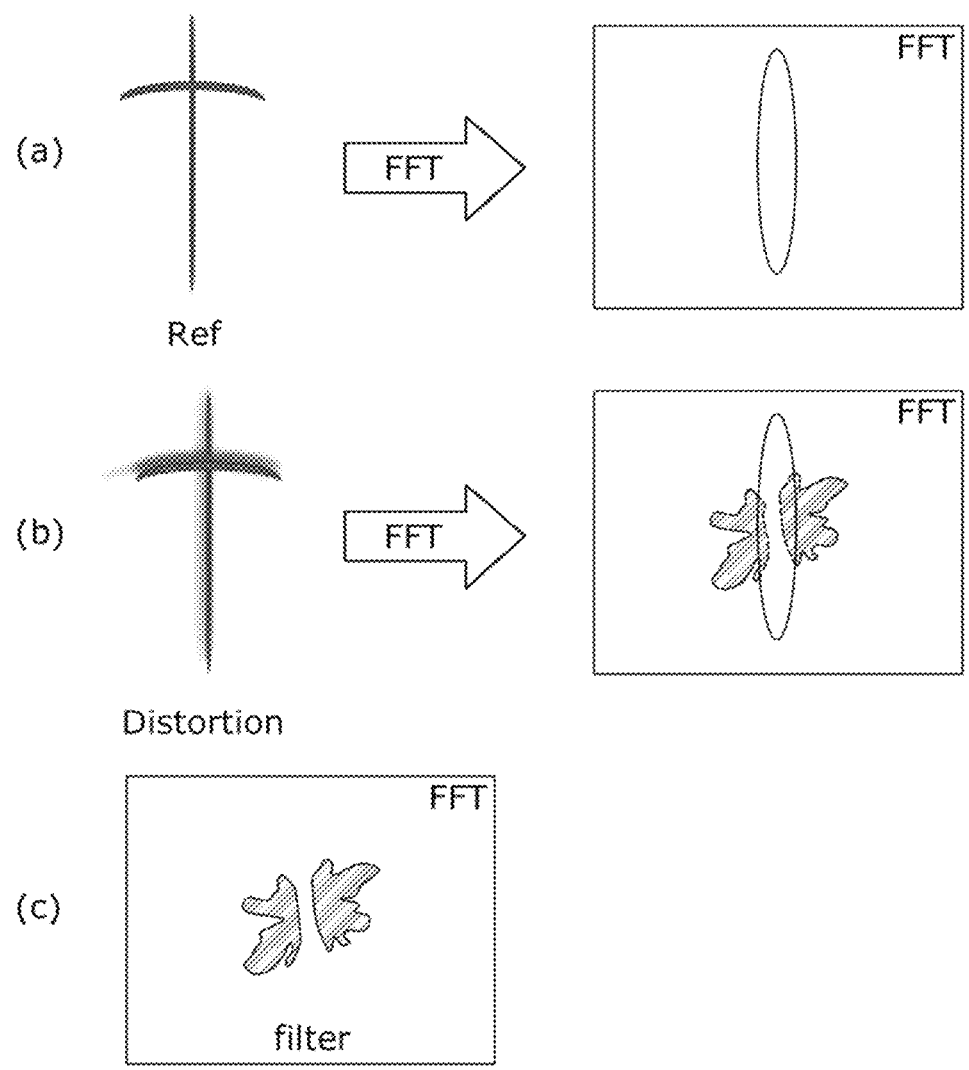
FIG. 14 is a diagram illustrating a process of generating correction data.

FIG. 14 is a diagram illustrating a process of generating correction data.

The reference value of the image of the marker MK shown in part (a) of FIG. 14 and the value obtained by performing fast Fourier transform (FFT) thereof are pre-stored values.

Part (b) of FIG. 14 shows an image obtained by extreme close-up shooting of the marker MK before photographing a subject, for example, a distorted image and a fast Fourier transform (FFT) value of the distorted image. First, the captured distorted image can be separated for each color (R, G, B). Then, fast Fourier transform (FFT) can be applied to each of the color-separated distorted images. The fast Fourier transform (FFT) value of the distorted image can be compared with the fast Fourier transform (FFT) value of the reference image. A distorted value can be found by comparing the fast Fourier transform (FFT) values of the distorted image and the reference image. For example, it can be seen that the distorted value corresponds to a hatched region in part (b) of FIG. 14.

Part (c) of FIG. 14 illustrates correction data, that is, a correction filter. As shown in part (c) of FIG. 14, correction data, that is, a correction filter can be generated based on the distorted value obtained at the previous step. A captured image of a real subject can be corrected by using the correction filter.

Figure 16:
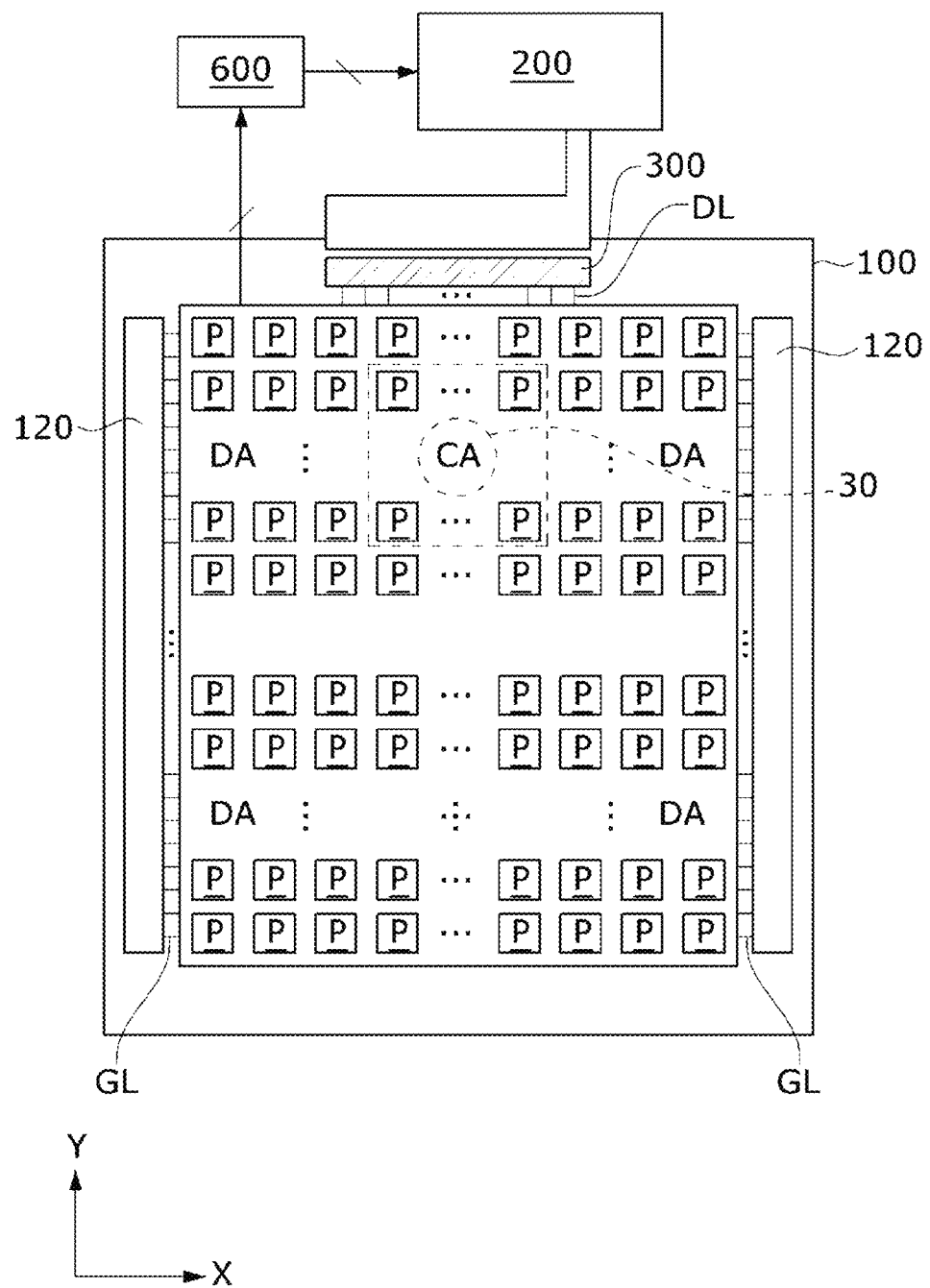
FIGS. 16 and 17 are views showing a display device according to an embodiment of the present disclosure.

The correction data generation process can be performed by, but not limited to, the sensor driver 600 shown in FIG. 16.

Figure 15:
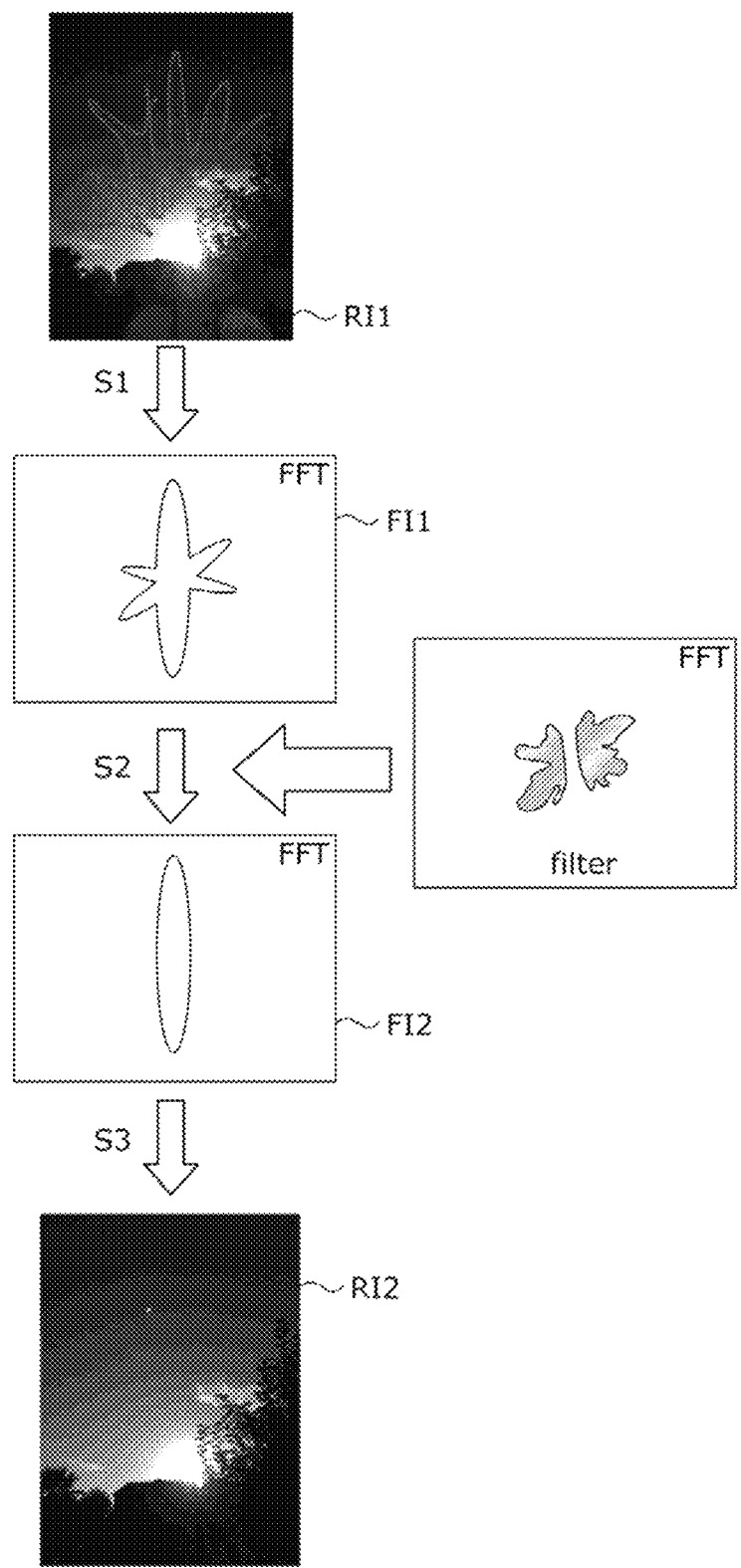
FIG. 15 is a diagram illustrating a process of correcting a distorted image.

FIG. 15 is a diagram illustrating a process of correcting a distorted image.

After generating correction data, that is, a correction filter, the subject can be photographed through the sensor 30. The pre-correction real image RI' obtained by photographing the subject can be FFTed to generate a pre-correction transformed image FI1 (S1). Then, the pre-correction transformed image FI1 can be filtered with the correction filter to blindly process the distorted region (S2). The corrected real image RI2 can be generated by inversely transforming the image whose distorted region has been blindly processed, for example, the post-correction transformed image FI2 (S3). This correction process can be performed for each color.

Figure 17:
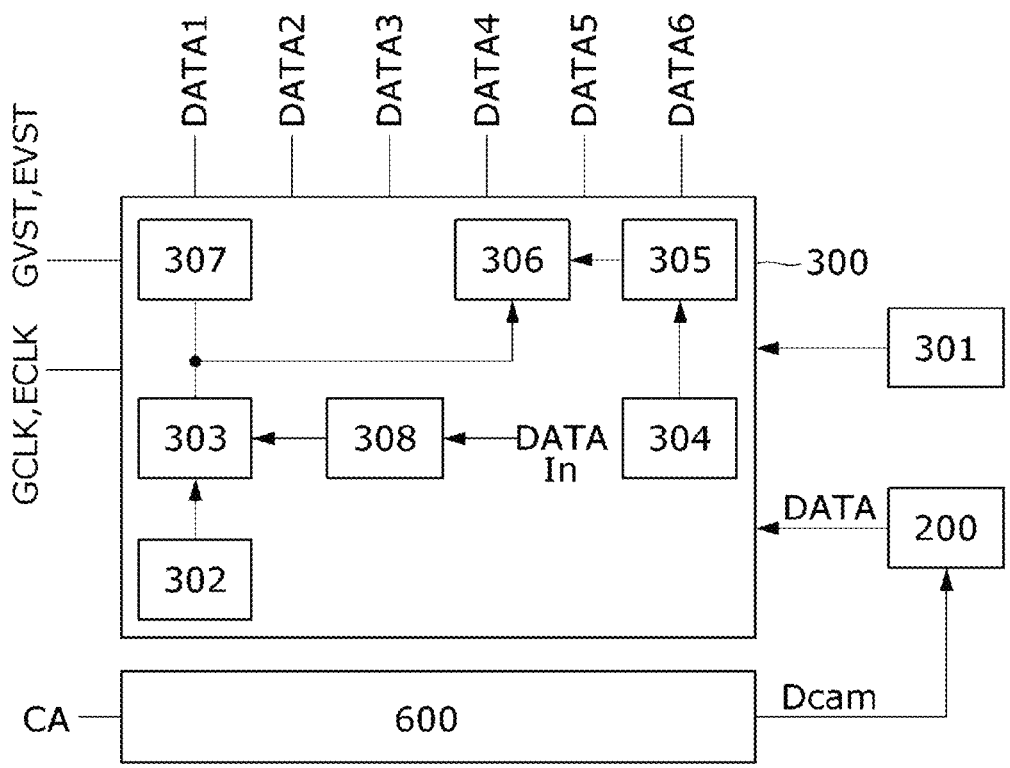

FIGS. 16 and 17 are views showing a display device according to an embodiment of the present disclosure.

With reference to FIGS. 16 and 17, the display device includes a display panel 100 in which a pixel array is disposed on the screen, a display panel driver, a sensor driver 600, and the like.

The pixel array of the display panel 100 includes data lines DL, gate lines GL crossing the data lines DL, and display pixels P arranged in a matrix form defined by the data lines DL and gate lines GL. The pixel array can further include power lines for supplying power to the pixels. The pixel array includes a main display area DA for displaying an input image and a sensor area CA in the display mode.

Light traveling through the sensing area CA is incident on the light-receiving surface of the sensor 30 disposed under the display panel 100.

The pixel array can be divided into a circuit layer 12 and a light emitting element layer 14 as shown in FIG. 2. A touch sensor array can be disposed on the light emitting element layer 14. Each of the pixels of the pixel array can include two to four subpixels as described above. Each of the subpixels includes a pixel circuit disposed on the circuit layer 12.

Each of the subpixels of the display pixel in the main display area DA and the sensor area CA includes a pixel circuit. The pixel circuit can include a driving element that supplies current to the light emitting element (OLED), a plurality of switch elements for sampling the threshold voltage of the driving element and switching the current path of the pixel circuit, and a capacitor maintaining the gate voltage of the driving element.

The display panel driver writes pixel data of an input image to the display pixels P. The display panel driver includes a data driver 306 that supplies a data voltage of pixel data to the data lines DL, and a gate driver 120 that sequentially supplies a gate pulse to the gate lines GL. The data driver 306 can be integrated in the drive IC 300. The display panel driver can further include a touch sensor driver. The data driver 306 can be integrated in the drive IC 300 together with the timing controller 303.

The drive IC 300 can include a data receiving and calculating unit 308, the timing controller 303, the data driver 306, a gamma compensation voltage generator 305, a power supply 304, and a second memory 302. The drive IC 300 can be connected to the host system 200, the first memory 301, and the display panel 100.

The drive IC 300 can be adhered to the display panel 100. The drive IC 300 receives pixel data of an input image and a timing signal from the host system 200, supplies a data voltage of the pixel data to the display pixels through the data lines DL, and synchronizes the data driver 306 and the gate driver 120.

The drive IC 300 is connected to the data lines DL through data output channels, and supplies a data voltage of pixel data to the data lines DL. The drive IC 300 can output a gate timing signal for controlling the gate driver 120 through gate timing signal output channels. The gate timing signal generated from the timing controller 303 can include a start pulse (gate start pulse, VST), a shift clock (gate shift clock, CLK), and the like. The start pulse VST and the shift clock CLK swing between the gate-on voltage VGL and the gate-off voltage VGH. The gate timing signal (VST, CLK) output from the level shifter 307 is applied to the gate driver 120 to control the shift operation of the gate driver 120.

The gate driver 120 can include a shift register formed on the circuit layer of the display panel 100 together with the pixel array. The shift register of the gate driver 120 supplies a gate signal to the gate lines GL in sequence under the control of the timing controller 30. The gate signal includes a scan pulse applied to the pixel circuit, a pulse of an emission control signal (hereinafter, referred to as "EM pulse"), an exposure signal TG applied to the sensor driving circuit, and the like. The shift register can include a scan driver that outputs a scan pulse, and an EM driver that outputs an EM pulse. In FIG. 17, GVST and GCLK are a gate timing signal input to the scan driver. EVST and ECLK are a gate timing signal input to the EM driver.

The data receiving and calculating unit 308 includes a receiving unit for receiving pixel data input as a digital signal from the host system 200, and a data operation unit that processes pixel data input through the receiving unit to improve image quality. The data operation unit can include a data restoration unit that decodes and restores compressed pixel data, and an optical compensation unit that adds a preset optical compensation value to the pixel data. The optical compensation value can be derived for each pixel and stored in the memories 301 and 302 in the form of a look-up table in order to compensate for luminance variations between pixels measured based on images captured by the camera in the manufacturing process.

An external compensation circuit can be applied to the display pixels and the drive IC. In this case, the data receiving and calculating unit 308 can compensate for driving variations and deterioration of the pixels by adding or multiplying the sensing result of the display pixels and the pixel data of the input image together.

The timing controller 303 provides pixel data of an input image received from the host system 200 to the data driver 306. The timing controller 303 generates a gate timing signal for controlling the gate driver 120 and a source timing signal for controlling the data driver 306 to thereby control operation timings of the gate driver 120 and the data driver 306.

The data driver 306 converts the pixel data (digital data) received from the timing controller 303 into a gamma compensation voltage through a digital to analog converter (hereinafter, referred to as "DAC") to output a data voltage. The data voltage output from the data driver 306 is supplied to the data lines DL of the pixel array through an output buffer connected to the data channel of the drive IC 300.

The gamma compensation voltage generator 305 divides the gamma reference voltage from the power supply 304 through a divider circuit to generate a gamma compensation voltage for each gray level. The gamma compensation voltage is an analog voltage in which a voltage is set for each gray level of pixel data. The gamma compensation voltage for each gray level output from the gamma compensation voltage generator 305 is provided to the DAC of the data driver 306. The gamma compensation voltage generator 305 can be implemented as a programmable voltage generation circuit capable of varying the voltage level of the output voltage according to a resistor setting value.

The power supply 304 generates power required for driving the pixel array of the display panel 100, the gate driver 120, and the drive IC 300 by using a DC-DC converter. The DC-DC converter can include a charge pump, a regulator, a buck converter, a boost converter, and the like. The power supply 304 can adjust the DC input voltage from the host system 200 to generate DC power, such as gamma reference voltage, gate-on voltage VGL, gate-off voltage VGH, pixel driving voltage ELVDD, low-potential power voltage ELVSS, reference voltage Vref, or initialization voltage Vini. The gamma reference voltage is supplied to the gamma compensation voltage generator 305. The gate-on voltage VGL and the gate-off voltage VGH are supplied to the level shifter 307 and the gate driver 120. Pixel power such as pixel driving voltage ELVDD, low-potential power voltage ELVSS, or initialization voltage Vini is supplied commonly to the pixels P. The pixel driving voltage ELVDD is set to a voltage higher than the low-potential power voltage ELVSS. The initialization voltage Vini and the reference voltage Vref can be set to a voltage that is lower than the pixel driving voltage ELVDD and is lower than or equal to the low-potential power voltage ELVSS.

The second memory 302 stores compensation values, register setting data, and the like received from the first memory 301 when power is supplied to the drive IC 300. The compensation values can be applied to various algorithms for improved image quality. The compensation values can include an optical compensation value. The register setting data is set in advance to control the operations of the data driver 306, the timing controller 303, the gamma compensation voltage generator 305, and the like. The first memory 301 can include a flash memory. The second memory 302 can include a static RAM (SRAM).

The host system 200 can be implemented as an application processor (AP) in a mobile terminal. The host system 200 can transmit pixel data of an input image to the drive IC 300 through a mobile industry processor interface (MIPI). The host system 200 can be connected to the drive IC 300 through a flexible printed circuit (FPC).

The sensor driver 600 can drive the sensor 30, correct (or compensate) an image captured by the sensor, and transmit the output data Dcam of the sensor 30 to the host system 200. The host system 200 transmits an enable signal to the sensor driver 600 in the sensing mode and receives data from the sensor driver 600.

The display panel 100 can be implemented with a flexible panel applicable to a flexible display. The flexible display can be changed in screen size by winding, folding or bending the flexible panel, and can be easily manufactured in various designs. The flexible display can be implemented as a rollable display, a foldable display, a bendable display, a slidable display, or the like. A flexible panel can be made of so-called "plastic OLED panel". The plastic OLED panel can include a back plate and a pixel array disposed on an organic thin film bonded on the back plate.

The back plate can be a polyethylene terephthalate (PET) substrate. The pixel array and the touch sensor array can be formed on an organic thin film substrate. The back plate can block moisture permeation toward an organic thin film so that the pixel array is not exposed to humidity. The organic thin film substrate can be a polyimide (PI) film substrate. A multi-layered buffer film made of an insulating material can be formed on the organic thin film substrate. The circuit layer 12 and the light emitting element 14 can be stacked on the organic thin film.

In the display device according to an embodiment of the present disclosure, the pixel circuit CPIX and the gate driver 120 disposed on the circuit layer 12 can include a plurality of transistors. The transistors can be implemented with an oxide thin film transistor (oxide TFT) including an oxide semiconductor, or a low temperature polysilicon (LTPS) TFT including LTPS. Each of the transistors can be implemented with a p-channel TFT or an re-channel TFT.

The transistor is a three-electrode element including a gate, a source, and a drain. The source is an electrode that supplies carriers to the transistor. Within the transistor, carriers start to flow from the source. The drain is an electrode through which carriers exit from the transistor. In the transistor, carriers flow from the source to the drain. In the case of an n-channel transistor, as carriers are electrons, the source voltage has a voltage lower than the drain voltage so that electrons can flow from the source to the drain. In the re-channel transistor, a current flows in a direction from the drain to the source. In the case of a p-channel transistor (PMOS), as carriers are holes, the source voltage is higher than the drain voltage so that holes can flow from the source to the drain. In the p-channel transistor, as holes flow from the source to the drain, a current flows from the source to the drain. It should be noted that the source and the drain of the transistor are not fixed. For example, the source and the drain can be changed according to an applied voltage. Therefore, the present disclosure is not limited due to the source and drain of the transistor. In the following description, the source and drain of the transistor will be referred to as first and second electrodes.

The gate pulse swings between a gate-on voltage and a gate-off voltage. The gate-on voltage is set to a voltage higher than the threshold voltage of the transistor, and the gate-off voltage is set to a voltage lower than the threshold voltage of the transistor. The transistor is turned on in response to the gate-on voltage, but it is turned off in response to the gate-off voltage. In the case of an n-channel transistor, the gate-on voltage can be a gate high voltage VGH, and the gate-off voltage can be a gate low voltage VGL. In the case of a p-channel transistor, the gate-on voltage can be a gate low voltage VGL, and the gate-off voltage can be a gate high voltage VGH.

The driving element of the pixel circuit can be implemented with a transistor. The driving element should have uniform electrical characteristics among all pixels, but there can be differences between pixels due to process variations and variations in element characteristics, and it can change according to the lapse of display driving time. To compensate for variations in electrical characteristics of the driving element, the display device can include an internal compensation circuit and an external compensation circuit. The internal compensation circuit is added to the pixel circuit at each of the subpixels, and samples the threshold voltage Vth and/or the mobility μ of the driving element, which vary according to the electrical characteristics of the driving element, and compensates the change in real time. The external compensation circuit transmits a threshold voltage and/or mobility of the driving element sensed through a sensing line connected to each of the subpixels to an external compensation unit. The compensation unit of the external compensation circuit compensates for changes in electrical characteristics of the driving element by modulating the pixel data of the input image in consideration of the sensing result. The external compensation circuit senses a voltage of the pixel that changes according to electrical characteristics of the driving element, and modulates the data of an input image in an external circuit based on the sensed voltage, thereby compensating for variations in electrical characteristics of the driving element between pixels.

Figure 18:
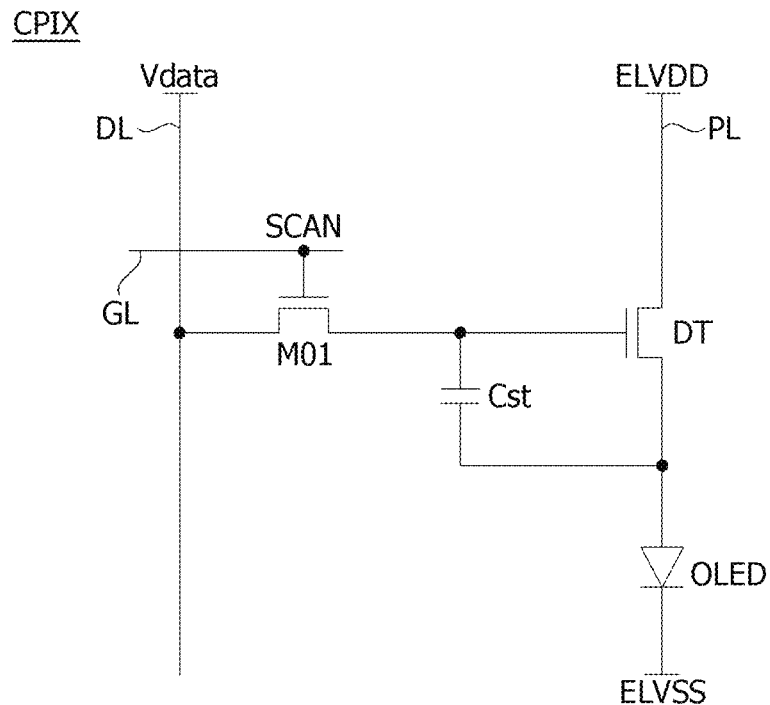
FIGS. 18 to 20 are circuit diagrams showing various pixel circuits applicable to the pixel circuit of the present disclosure.
Figure 19:
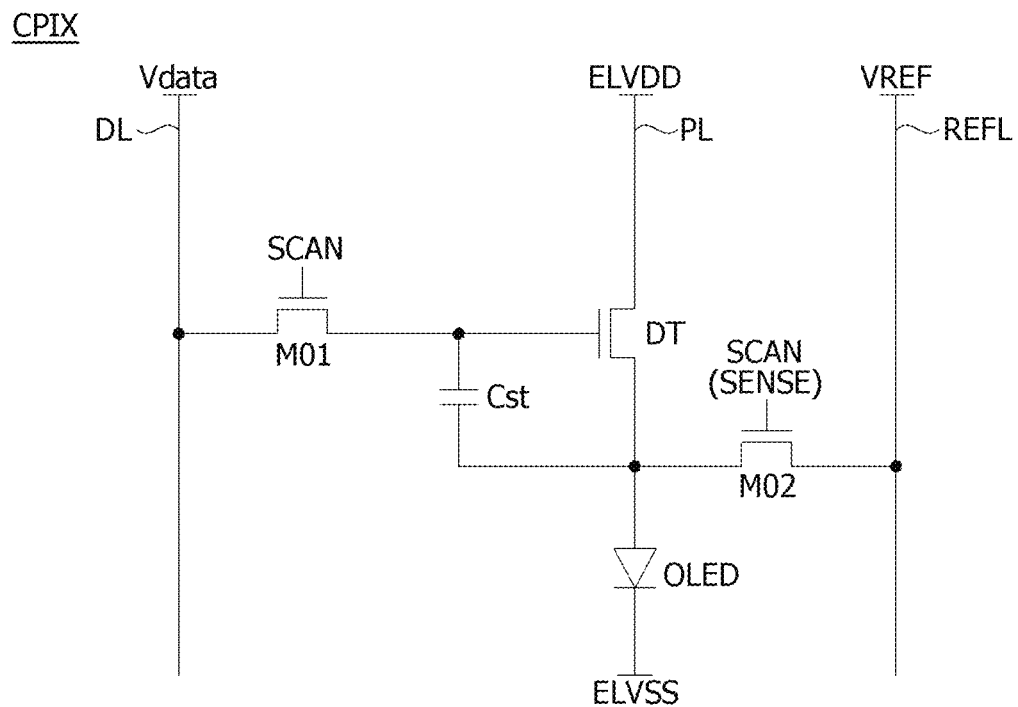
Figure 20:
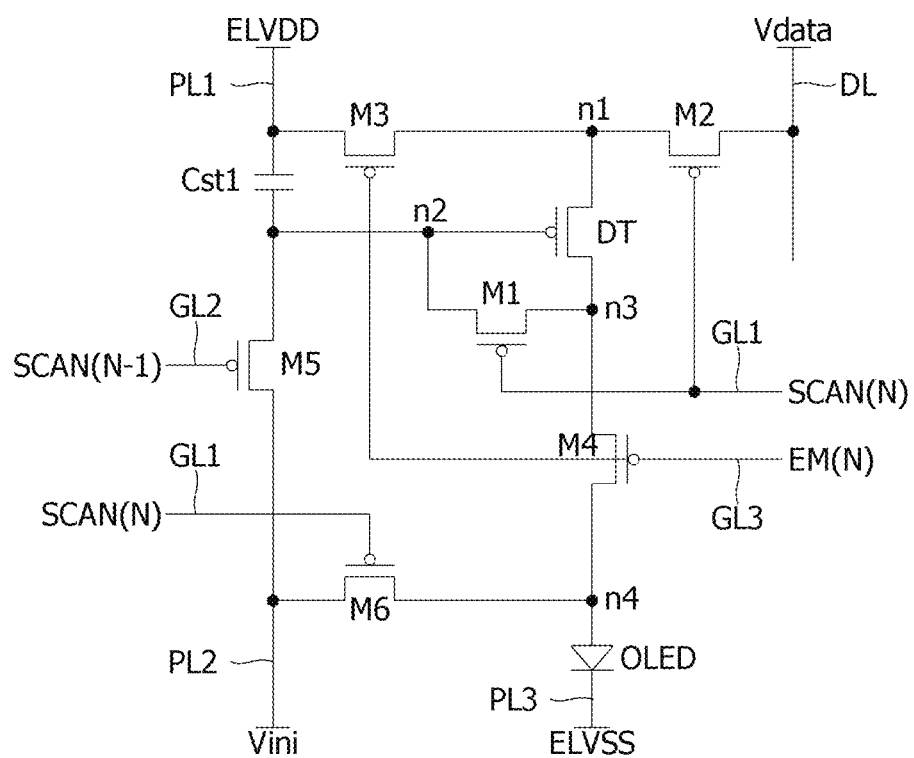

FIGS. 18 to 20 are circuit diagrams showing various pixel circuits applicable to the pixel circuit of the present disclosure. The pixel circuits shown in FIGS. 18 to 20 can be applied as the same circuit in the display pixels of the main display area DA and the sensor area CA, or can be selectively applied as partially different circuits.

With reference to FIG. 18, the pixel circuit includes a light emitting element OLED, a driving element DT that supplies a current to the light emitting element OLED, a switch element M01 connecting the data line DL in response to the scan pulse SCAN, and a capacitor Cst connected to the gate of the driving element DT.

The pixel driving voltage ELVDD is applied through the power line PL to the first electrode (or driving drain) of the driving element. The driving element DT drives the light emitting element OLED by supplying a current to the light emitting element OLED according to the gate-source voltage Vgs. When the forward voltage between the anode electrode and the cathode electrode is higher than or equal to the threshold voltage, the light emitting element OLED is turned on to emit light. The capacitor Cst is connected between the gate electrode and the source electrode of the driving element DT to maintain the gate-source voltage Vgs of the driving element DT.

FIG. 19 is an example of a pixel circuit connected to an external compensation circuit.

With reference to FIG. 19, the pixel circuit further includes a second switch element M02 connected between the reference voltage line REFL and the second electrode (or source) of the driving element DT. The second switch element M02 applies the reference voltage Vref in response to the scan pulse SCAN or a separate sensing pulse SENSE.

In the sensing mode, a current flowing through the channel of the driving element DT or a node voltage between the driving element DT and the light emitting element OLED is sensed through the reference line REFL. The current flowing through the reference line REFL is converted into a voltage through an integrator and the voltage is converted into digital data through an ADC. This digital data is sensing data including information on the threshold voltage or mobility of the driving element DT. The sensing data is transmitted to the data receiving and calculating unit 308.

Figure 21:
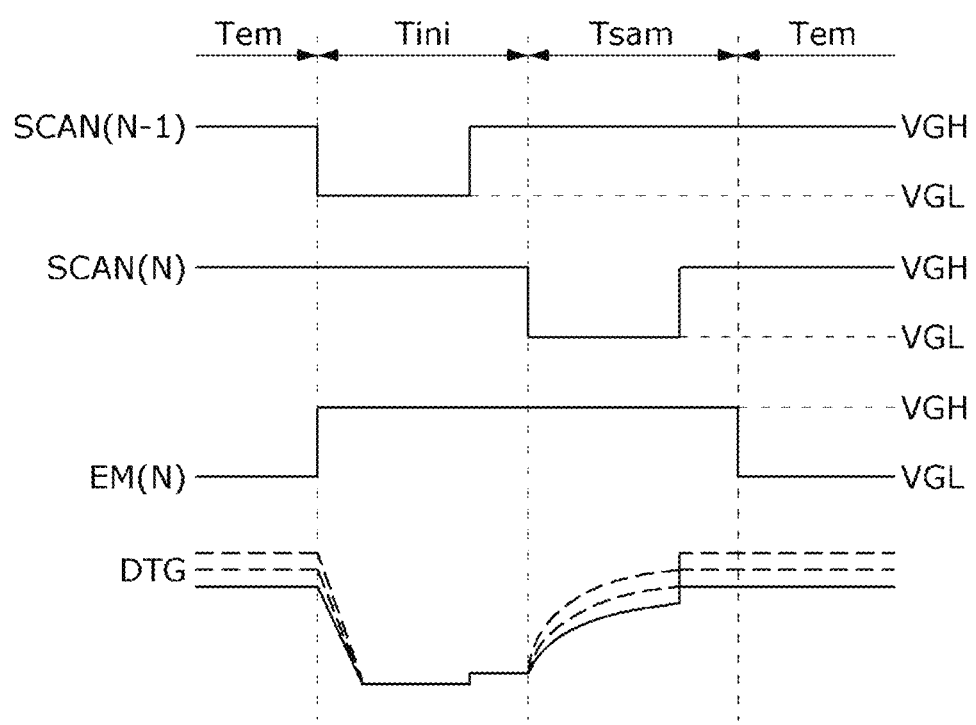
FIG. 21 is a diagram illustrating a method of driving the pixel circuit shown in FIG. 20.

FIG. 20 is a circuit diagram showing an example of a pixel circuit to which an internal compensation circuit is applied. FIG. 21 is a diagram illustrating a method of driving the pixel circuit shown in FIG. 20.

With reference to FIGS. 20 and 21, the pixel circuit includes a light emitting element OLED, a driving element DT for supplying a current to the light emitting element OLED, and a switch circuit for switching voltages applied to the light emitting element OLED and the driving element DT.

The switch circuit is connected to the power lines PL1, PL2 and PL3 to which the pixel driving voltage ELVDD, the low-potential power voltage ELVSS and the initialization voltage Vini are applied, the data line DL, and the gate lines GL1, GL2 and GL3, and it switches the voltage applied to the light emitting element OLED and the driving element DT in response to the scan pulse SCAN(N−1) or SCAN(N) and the EM pulse EM(N).

The switch circuit includes an internal compensation circuit that samples the threshold voltage Vth of the driving element DT by using a plurality of switch elements M1 to M6 and stores it in the capacitor Cst1, and compensates the gate voltage of the driving element DT as much as the threshold voltage Vth of the driving element DT. Each of the driving element DT and the switch elements M1 to M6 can be implemented with a p-channel TFT.

The driving period of the pixel circuit can be divided into an initialization period Tini, a sampling period Tsam, and an emission period Tem as shown in FIG. 21.

The $N^{th}$ scan pulse SCAN(N) is generated as the gate-on voltage VGL during the sampling period Tsam and is applied to the first gate line GL1. The $N-1^{th}$ scan pulse SCAN(N−1) is generated as the gate-on voltage VGL during the initialization period Tini prior to the sampling period and is applied to the second gate line GL2. The EM pulse EM(N) is generated as the gate-off voltage VGH during the initialization period Tini and the sampling period Tsam and is applied to the third gate line GL3.

During the initialization period Tini, the $N-1^{th}$ scan pulse SCAN(N−1) is generated as the gate-on voltage VGL, and the voltage of each of the $N^{th}$ scan pulse SCAN(N) and the EM pulse EM(N) is the gate-off voltage VGH. During the sampling period Tsam, the $N^{th}$ scan pulse SCAN(N) is generated as a pulse of the gate-on voltage (VGL), and the voltage of each of the $N-1^{th}$ scan pulse SCAN(N−1) and the EM pulse EM(N) is the gate-off voltage VGH. During at least some of the emission period Tem, the EM pulse EM(N) is generated as the gate-on voltage VGL, and the voltage of each of the $N-1^{th}$ scan pulse SCAN(N−1) and the $N^{th}$ scan pulse SCAN(N) is generated as the gate-off voltage VGH.

During the initialization period Tini, the fifth switch element M5 is turned on according to the gate-on voltage VGL of the $N-1^{th}$ scan pulse SCAN(N−1), initializing the pixel circuit. During the sampling period Tsam, the first and second switch elements M1 and M2 are turned on according to the gate-on voltage VGL of the $N^{th}$ scan pulse SCAN(N), and the data voltage Vdata compensated as much as the threshold voltage of the driving element DT is stored in the capacitor Cst1. At the same time, the sixth switch element M6 is turned on during the sampling period Tsam and lowers the voltage of the fourth node n4 to the reference voltage Vref, suppressing the emission of the light emitting element OLED.

During the emission period Tem, the third and fourth switch elements M3 and M4 are turned on and the light emitting element OLED emits light. During the emission period Tem, to accurately express the luminance of the low gradation, the voltage level of the EM pulse EM(N) can be inverted at a preset duty ratio between the gate-on voltage VGL and the gate-off voltage VGH. In this case, the third and fourth switch elements M3 and M4 can be repeatedly turned on and off according to the duty ratio of the EM pulse EM(N) during the emission period Tem.

The light emitting element OLED can be implemented with an organic light emitting diode or an inorganic light emitting diode. Hereinafter, a description is given of an example in which the light emitting element OLED is implemented with an organic light emitting diode.

The anode electrode of the light emitting element OLED is connected to the fourth node n4 between the fourth and sixth switch elements M4 and M6. The fourth node n4 is connected to the anode electrode of the light emitting element OLED, the second electrode of the fourth switch element M4, and the second electrode of the sixth switch element M6. The cathode electrode of the light emitting element OLED is connected to the VSS line PL3 to which the low-potential power voltage ELVSS is applied. The light emitting element OLED emits light with a current Ids flowing according to the gate-source voltage Vgs of the driving element DT. The current path of the light emitting element OLED is switched by the third and fourth switch elements M3 and M4.

The capacitor Cst1 is connected between the VDD line PL1 and the second node n2. The data voltage Vdata compensated as much as the threshold voltage Vth of the driving element DT is charged in the capacitor Cst1. As the data voltage Vdata is compensated as much as the threshold voltage Vth of the driving element DT at each of the subpixels, characteristic variations of the driving element DT are compensated for at the subpixels.

The first switch element M1 is turned on in response to the gate-on voltage VGL of the $N^{th}$ scan pulse SCAN(N) to thereby connect the second node n2 and the third node n3. The second node n2 is connected to the gate electrode of the driving element DT, the first electrode of the capacitor Cst1, and the first electrode of the first switch element M1. The third node n3 is connected to the second electrode of the driving element DT, the second electrode of the first switch element M1, and the first electrode of the fourth switch element M4. The gate electrode of the first switch element M1 is connected to the first gate line GL1 to receive the $N^{th}$ scan pulse SCAN(N). The first electrode of the first switch element M1 is connected to the second node n2, and the second electrode of the first switch element M1 is connected to the third node n3.

As the first switch element M1 is turned on for very short one horizontal period (1H) in which the $N^{th}$ scan pulse SCAN(N) is generated as the gate-on voltage VGL in one frame period, a leakage current can occur in the off state. To suppress the leakage current of the first switch element M1, the first switch element M1 can be implemented with a transistor having a dual gate structure in which two transistors M1a and M1b are connected in series.

The second switch element M2 is turned on in response to the gate-on voltage VGL of the $N^{th}$ scan pulse SCAN(N) to thereby supply the data voltage Vdata to the first node n1. The gate electrode of the second switch element M2 is connected to the first gate line GL1 to receive the $N^{th}$ scan pulse SCAN(N). The first electrode of the second switch element M2 is connected to the first node n1. The second electrode of the second switch element M2 is connected to the data line DL to which the data voltage Vdata is applied. The first node n1 is connected to the first electrode of the second switch element M2, the second electrode of the third switch element M3, and the first electrode of the driving element DT.

The third switch element M3 is turned on in response to the gate-on voltage VGL of the EM pulse EM(N) to thereby connect the VDD line PL1 to the first node n1. The gate electrode of the third switch element M3 is connected to the third gate line GL3 to receive the EM pulse EM(N). The first electrode of the third switch element M3 is connected to the VDD line PL1. The second electrode of the third switch element M3 is connected to the first node n1.

The fourth switch element M4 is turned on in response to the gate-on voltage VGL of the EM pulse EM(N) to thereby connect the third node n3 to the anode electrode of the light emitting element OLED. The gate electrode of the fourth switch element M4 is connected to the third gate line GL3 to receive the EM pulse EM(N). The first electrode of the fourth switch element M4 is connected to the third node n3, and the second electrode is connected to the fourth node n4.

The fifth switch element M5 is turned on in response to the gate-on voltage VGL of the N-1$^{th}$ scan pulse SCAN(N-1) to thereby connect the second node n2 to the Vini line PL2. The gate electrode of the fifth switch element M5 is connected to the second gate line GL2 to receive the N-1$^{th}$ scan pulse SCAN(N-1). The first electrode of the fifth switch element M5 is connected to the second node n2, and the second electrode is connected to the Vini line PL2. To suppress the leakage current of the fifth switch element M5, the fifth switch element M5 can be implemented with a transistor having a dual gate structure in which two transistors M5a and M5b are connected in series.

The sixth switch element M6 is turned on in response to the gate-on voltage VGL of the N$^{th}$ scan pulse SCAN(N) to thereby connect the Vini line PL2 to the fourth node n4. The gate electrode of the sixth switch element M6 is connected to the first gate line GL1 to receive the N$^{th}$ scan pulse SCAN(N). The first electrode of the sixth switch element M6 is connected to the Vini line PL2, and the second electrode is connected to the fourth node n4.

The gate electrodes of the fifth and sixth switch elements M5 and M6 can be commonly connected to the second gate line GL2 to which the N-1$^{th}$ scan pulse SCAN(N-1) is applied. In this case, the fifth and sixth switch elements M5 and M6 can be turned on at the same time in response to the N-1$^{th}$ scan pulse SCAN(N-1).

The driving element DT drives the light emitting element OLED by adjusting the current flowing through the light emitting element OLED according to the gate-source voltage Vgs. The driving element DT includes a gate electrode connected to the second node n2, a first electrode connected to the first node n1, and a second electrode connected to the third node n3.

During the initialization period Tini, the N-1$^{th}$ scan pulse SCAN(N-1) is generated as the gate-on voltage VGL. The N$^{th}$ scan pulse SCAN(N) and the EM pulse EM(N) maintain the gate-off voltage VGH during the initialization period Tini. Hence, the fifth switch element M5 is turned on during the initialization period Tini, so that the second and fourth nodes n2 and n4 are initialized to Vini. A hold period Th can be configured between the initialization period Tini and the sampling period Tsam. In the hold period Th, the scan pulses SCAN(N-1) and SCAN(N) and the EM pulse EM(N) are at the gate-off voltage VGH.

During the sampling period Tsam, the Na' scan pulse SCAN(N) is generated as the gate-on voltage VGL. The pulse of the Na' scan pulse SCAN(N) is synchronized with the data voltage Vdata of the N$^{th}$ pixel line. The N-1$^{th}$ scan pulse SCAN(N-1) and the EM pulse EM(N) maintain the gate-off voltage VGH during the sampling period Tsam. Hence, the first and second switch elements M1 and M2 are turned on during the sampling period Tsam.

During the sampling period Tsam, the gate voltage DTG of the driving element DT is increased by the current flowing through the first and second switch elements M1 and M2. When the driving element DT is turned off, the gate node voltage DTG is Vdata-|Vth|. Here, the voltage of the first node n1 is also Vdata-|Vth|. During the sampling period Tsam, the gate-source voltage Vgs of the driving element DT is |Vgs|=Vdata-(Vdata-|Vth|)=|Vth|.

During the emission period Tem, the EM pulse EM(N) can be generated as the gate-on voltage VGL. During the emission period Tem, the voltage of the EM pulse EM(N) can be inverted at a preset duty ratio. Hence, the EM pulse EM(N) can be generated as the gate-on voltage VGL during at least some of the emission period Tem.

When the EM pulse EM(N) is at the gate-on voltage VGL, a current flows between the ELVDD and the light emitting element OLED, so that the light emitting element OLED can emit light. During the emission period Tem, the N-1$^{th}$ and N$^{th}$ scan pulses SCAN(N-1) and SCAN(N) maintain the gate-off voltage VGH. During the emission period Tem, the third and fourth switch elements M3 and M4 are turned on according to the gate-on voltage VGL of the EM pulse EM(N). When the EM pulse EM(N) is at the gate-on voltage VGL, the third and fourth switch elements M3 and M4 are turned on, so that a current flows through the light emitting element OLED. Here, Vgs of the driving element DT is |Vgs|=ELVDD-(Vdata-|Vth|), and the current flowing through the light emitting element OLED is K(VDD-Vdata)$^2$, where K is a constant value determined according to the charge mobility, parasitic capacitance, and channel capacity of the driving element DT.

Figure 22:
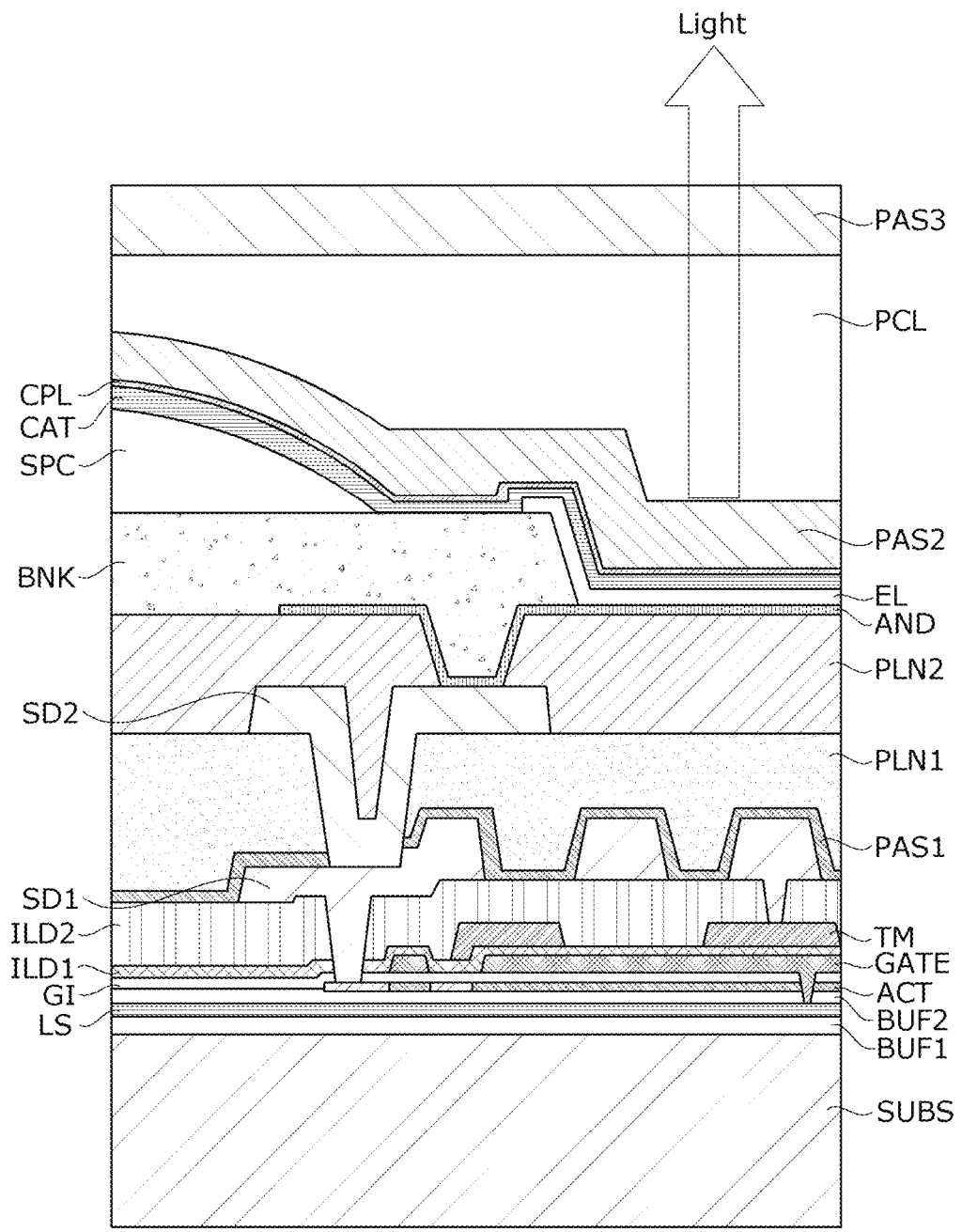
FIG. 22 is a cross-sectional view showing in detail a cross-sectional structure of a pixel of the display device.

FIG. 22 is a cross-sectional view showing in detail a cross-sectional structure of a pixel of the display device.

With reference to FIG. 22, a first buffer layer BUF1 can be formed on the substrate SUBS. A first metal layer can be formed on the first buffer layer BUF1. A second buffer layer BUF2 can be formed on the first metal layer. The first metal layer is patterned in a photolithography process. The first metal layer can include a light shield pattern (LS). The light shield pattern LS blocks external light so that light is not irradiated to the active layer of the transistor. Each of the first and second buffer layers BUF1 and BUF2 can be made of an inorganic insulating material, and can have a structure in which one or more insulating layers are stacked.

An active layer ACT can be formed of a semiconductor material, for example, a-Si, deposited on the second buffer layer BUF2, and can be patterned through a photolithography process. The active layer ACT includes an active pattern of a transistor. A portion of the active layer ACT can be metallized by ion doping. The metallized portion can be used as a jumper pattern connecting metal layers at some nodes of the pixel circuit so as to connect components of the pixel circuit.

A gate insulating layer GI can be formed on the active layer ACT. The gate insulating layer GI can be made of an inorganic insulating material. A second metal layer can be formed on the gate insulating layer GI. The second metal layer can be patterned through a photolithography process. The second metal layer can include a gate line and a gate electrode GATE, a bottom electrode of the storage capacitor Cst1, a jumper pattern connecting the patterns of the first metal layer and the third metal layer, and the like.

A first interlayer insulating film ILD1 can cover the second metal layer. A third metal layer can be formed on the first interlayer insulating film ILD1, and a second interlayer insulating film ILD2 can cover the third metal layer. The third metal layer can be patterned through a photolithography process. The third metal layer can include metal patterns TM such as the top electrode of the storage capacitor Cst1 and the third power line. The first and second interlayer insulating films ILD1 and ILD2 can include an inorganic insulating material.

A fourth metal layer can be formed on the second interlayer insulating film ILD2, and an inorganic insulating film PAS1 and a first planarization layer PLN1 can be stacked thereon. The fifth metal layer can be formed on the first planarization layer PLN1.

Some patterns of the fourth metal layer can be connected to the third metal layer through a contact hole penetrating the first planarization layer PLN1 and the inorganic insulating film PAS1. The first and second planarization layers PLN1 and PLN2 can be made of an organic insulating material that planarizes the surface.

The fourth metal layer can include the first and second electrodes of a transistor connected to the active pattern of the transistor through a contact hole penetrating the second interlayer insulating film ILD2. The data line DL and the power lines PL1, PL2 and PL3 can be implemented with a fourth metal layer pattern SD1 or a fifth metal layer pattern SD2.

The anode electrode AND of the light emitting element OLED can be formed on the second planarization layer PLN2. The anode electrode AND can be connected to an electrode of a transistor used as a switch element or a driving element through a contact hole penetrating the second planarization layer PLN2. The anode electrode AND can be made of a transparent or translucent electrode material.

The pixel defining film BNK can cover the anode electrode AND of the light emitting element OLED. The pixel defining film BNK is formed in a pattern defining an emission region (or, opening region) through which light passes from each of the pixels to the outside. A spacer SPC can be formed on the pixel defining film BNK. The pixel defining film BNK and the spacer SPC can be integrated with the same organic insulating material. The spacer SPC secures a gap between a fine metal mask (FMM) and the anode electrode AND so that the FMM does not contact the anode electrode AND in the deposition process of the organic compound layer EL.

An organic compound layer EL is formed in the emission region of each of the pixels defined by the pixel defining film BNK. The cathode electrode CAT of the light emitting element OLED is formed on the entire surface of the display panel 100 so as to cover the pixel defining film BNK, the spacer SPC, and the organic compound layer EL. The cathode electrode CAT can be connected to the VSS line PL3 formed by any one of the lower metal layers. A capping layer CPL can cover the cathode electrode CAT. The capping layer CPL is formed of an inorganic insulating material and protects the cathode electrode CAT by blocking the penetration of air and out-gassing of an organic insulating material applied on the capping layer CPL. An inorganic insulating film PAS2 can cover the capping layer CPL, and a planarization layer PCL of the encapsulation layer can be formed on the inorganic insulating film PAS2. The planarization layer PCL can include an organic insulating material. The inorganic insulating film PAS3 of the encapsulation layer can be formed on the planarization layer PCL.

What is claimed is:

1. A display device comprising:
   a display panel that comprises a substrate, a light shield layer disposed on the substrate, a light emitting element layer disposed on the light shield layer and including a plurality of subpixels, an encapsulation layer disposed on the light emitting element layer, and a polarizing layer disposed on the encapsulation layer; and
   a sensor disposed under the display panel,
   wherein a display area of the display panel includes a main display area and a sensor area,
   wherein the sensor is arranged to photoelectrically convert light received through the sensor area of the display panel, and
   wherein the sensor area includes a radial pattern.

2. The display device of claim 1, wherein:
   the light emitting element layer includes a first electrode, a bank layer disposed on the first electrode to expose a portion of the first electrode, an organic compound layer disposed on the first electrode exposed by the bank layer, and a second electrode disposed on the organic compound layer; and
   at least some of the light shield layer, a plurality of layers in the light emitting element layer, and the polarizing layer include the radial pattern.

3. The display device of claim 2, wherein at least one of the light shield layer, the plurality of layers in the light emitting element layer, and the polarizing layer includes a linear pattern that passes through a center of the radial pattern and crosses the radial pattern.

4. The display device of claim 3, wherein the radial pattern includes circle patterns separated at an equal interval.

5. The display device of claim 3, wherein:
   the radial pattern is disposed on at least one of the light shield layer, the plurality of layers in the light emitting element layer, and the polarizing layer; and
   the linear pattern is disposed on at least one other layer separated from a layer on which the radial pattern is formed among the light shield layer, the plurality of layers in the light emitting element layer, and the polarizing layer.

6. The display device of claim 2, wherein the radial pattern includes a plurality of concentric circle patterns separated at an equal interval.

7. A display device comprising:
   a display panel that comprises a substrate, a light shield layer disposed on the substrate, a light emitting element layer disposed on the light shield layer and including a plurality of subpixels, an encapsulation layer disposed on the light emitting element layer, a color filter layer disposed on the encapsulation layer, and a display area in which an adhesive layer disposed on the color filter layer is disposed; and
   a sensor disposed under the display panel,
   wherein the display area of the display panel includes a main display area and a sensor area,
   wherein the sensor is arranged to photoelectrically convert light received through the sensor area of the display panel, and
   wherein the sensor area includes a radial pattern.

8. The display device of claim 7, wherein:
   the light emitting element layer includes a first electrode, a black bank disposed on the first electrode to expose a portion of the first electrode, an organic compound layer disposed on the first electrode exposed by the black bank, and a second electrode disposed on the organic compound layer;
   the color filter layer includes color filters and a black matrix disposed between the color filters; and
   at least one of the light shield layer, a plurality of layers in the light emitting element layer, the color filter layer, and the adhesive layer includes the radial pattern.

9. The display device of claim 8, wherein at least one of the light shield layer, the plurality of layers in the light emitting element layer, the color filter layer, and the adhesive layer includes a linear pattern that passes through a center of the radial pattern and crosses the radial pattern.

10. The display device of claim 9, wherein the radial pattern includes a circle patterns separated at an equal interval.

11. The display device of claim 9, wherein:
    the radial pattern is disposed on one or more of the light shield layer, the plurality of layers in the light emitting element layer, the color filter layer, and the adhesive layer; and the linear pattern is disposed on one or more other layers separated from the layer on which the radial pattern is formed among the light shield layer, the plurality of layers in the light emitting element layer, the color filter layer, and the adhesive layer.

12. The display device of claim 8, wherein the radial pattern includes a plurality of concentric circle patterns separated at an equal interval.

13. The display device of claim 1, wherein:
the main display area is adjacent to the sensor area; and
a pixels-per-inch (PPI) of the main display area is greater than a PPI of the sensor area.

14. A display device comprising:
a display panel that comprises a substrate, a light shield layer disposed on the substrate, a light emitting element layer disposed on the light shield layer and including a plurality of subpixels, an encapsulation layer disposed on the light emitting element layer, a black matrix layer disposed on the encapsulation layer, and a display area in which a light absorption film disposed on the black matrix layer is disposed; and
a sensor disposed under the display panel,
wherein the display area of the display panel includes a main display area and a sensor area,
wherein the sensor is arranged to photoelectrically convert light received through the sensor area of the display panel, and
wherein the sensor area includes a radial pattern.

15. The display device of claim 14, wherein:
the light emitting element layer includes a first electrode, a black bank disposed on the first electrode to expose a portion of the first electrode, an organic compound layer disposed on the first electrode exposed by the black bank, and a second electrode disposed on the organic compound layer; and
at least one of the light shield layer, a plurality of layers in the light emitting element layer, the black matrix layer, and the light absorption film includes the radial pattern.

16. The display device of claim 15, wherein at least some of the light shield layer, the plurality of layers in the light emitting element layer, the black matrix layer, and the light absorption film include a linear pattern that passes through a center of the radial pattern and crosses the radial pattern.

17. The display device of claim 16, wherein the radial pattern includes circle pattern separated at an equal interval.

18. The display device of claim 16, wherein:
the radial pattern is disposed on at least one of the light shield layer, the plurality of layers in the light emitting element layer, the black matrix layer, and the light absorption film; and
the linear pattern is disposed on at least one other layer separated from the layer on which the radial pattern is formed among the light shield layer, the plurality of layers in the light emitting element layer, the black matrix layer, and the light absorption film.

19. The display device of claim 15, wherein the radial pattern includes a plurality of concentric circle patterns separated at an equal interval.

20. The display device of claim 14, wherein:
the main display area is adjacent to the sensor area; and
the PPI of the main display area is greater than a PPI of the sensor area.

* * * * *